(12) United States Patent
Lu et al.

(10) Patent No.: US 10,204,689 B1
(45) Date of Patent: Feb. 12, 2019

(54) NON-VOLATILE MEMORY WITH METHODS TO REDUCE CREEP-UP FIELD BETWEEN DUMMY CONTROL GATE AND SELECT GATE

(71) Applicant: SanDisk Technologies LLC, Plano, TX (US)

(72) Inventors: Ching-Huang Lu, Fremont, CA (US); Anubhav Khandelwal, San Jose, CA (US); Changyuan Chen, San Ramon, CA (US); Cynthia Hsu, Milpitas, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/699,513

(22) Filed: Sep. 8, 2017

Related U.S. Application Data

(60) Provisional application No. 62/536,939, filed on Jul. 25, 2017.

(51) Int. Cl.
| | | |
|---|---|---|
| *G11C 16/34* | (2006.01) | |
| *G11C 16/26* | (2006.01) | |
| *G11C 16/04* | (2006.01) | |
| *G11C 16/24* | (2006.01) | |
| *G11C 11/56* | (2006.01) | |

(52) U.S. Cl.
CPC ...... *G11C 16/3427* (2013.01); *G11C 11/5642* (2013.01); *G11C 16/0483* (2013.01); *G11C 16/24* (2013.01); *G11C 16/26* (2013.01); *G11C 16/3454* (2013.01)

(58) Field of Classification Search
CPC . G11C 16/3427; G11C 16/0483; G11C 16/24; G11C 16/26; G11C 16/3454
USPC ............................ 365/185.17, 185.21, 185.2
See application file for complete search history.

(56) References Cited

U.S. PATENT DOCUMENTS

| 5,804,425 A | 9/1998 | Barry et al. |
| 6,982,905 B2 | 1/2006 | Nguyen |
| (Continued) | | |

OTHER PUBLICATIONS

International Search Report & The Written Opinion of the International Searching Authority dated Aug. 22, 2018, International Application No. PCT/US2018/032439 filed May 11, 2018.

*Primary Examiner* — Alexander Sofocleous
*Assistant Examiner* — Alfredo Bermudez Lozada
(74) *Attorney, Agent, or Firm* — Vierra Magen Marcus LLP

(57) ABSTRACT

Non-volatile storage systems and method of operating non-volatile storage systems are disclosed. A crept up voltage on a memory cell control gate adjacent to a select gate is prevented, reduced, and/or discharged. In some aspects, the crept up voltage is not allowed to happen on the memory cell next to the select gate after a sensing operation. In some aspects, the voltage may creep up on the memory cell control gate after a sensing operation, but it is discharged. Reducing and/or preventing the crept up voltage may reduce the electric field between the dummy memory cell and select gate transistor. This may prevent, or at least reduce, changes in threshold voltage of the select gate transistor. Additional problems may also be solved by a reduction of the crept up voltage on the dummy memory cell control gates.

20 Claims, 24 Drawing Sheets

(56) References Cited

U.S. PATENT DOCUMENTS

| | | | |
|---|---|---|---|
| 7,408,811 B2* | 8/2008 | Shirota | G11C 16/0483 365/176 |
| 9,087,601 B2 | 7/2015 | Dutta et al. | |
| 9,286,994 B1* | 3/2016 | Chen | G11C 16/08 |
| 9,336,892 B1 | 5/2016 | Chen et al. | |
| 9,443,605 B1 | 9/2016 | Chen et al. | |
| 9,620,233 B1 | 4/2017 | Dong et al. | |

* cited by examiner

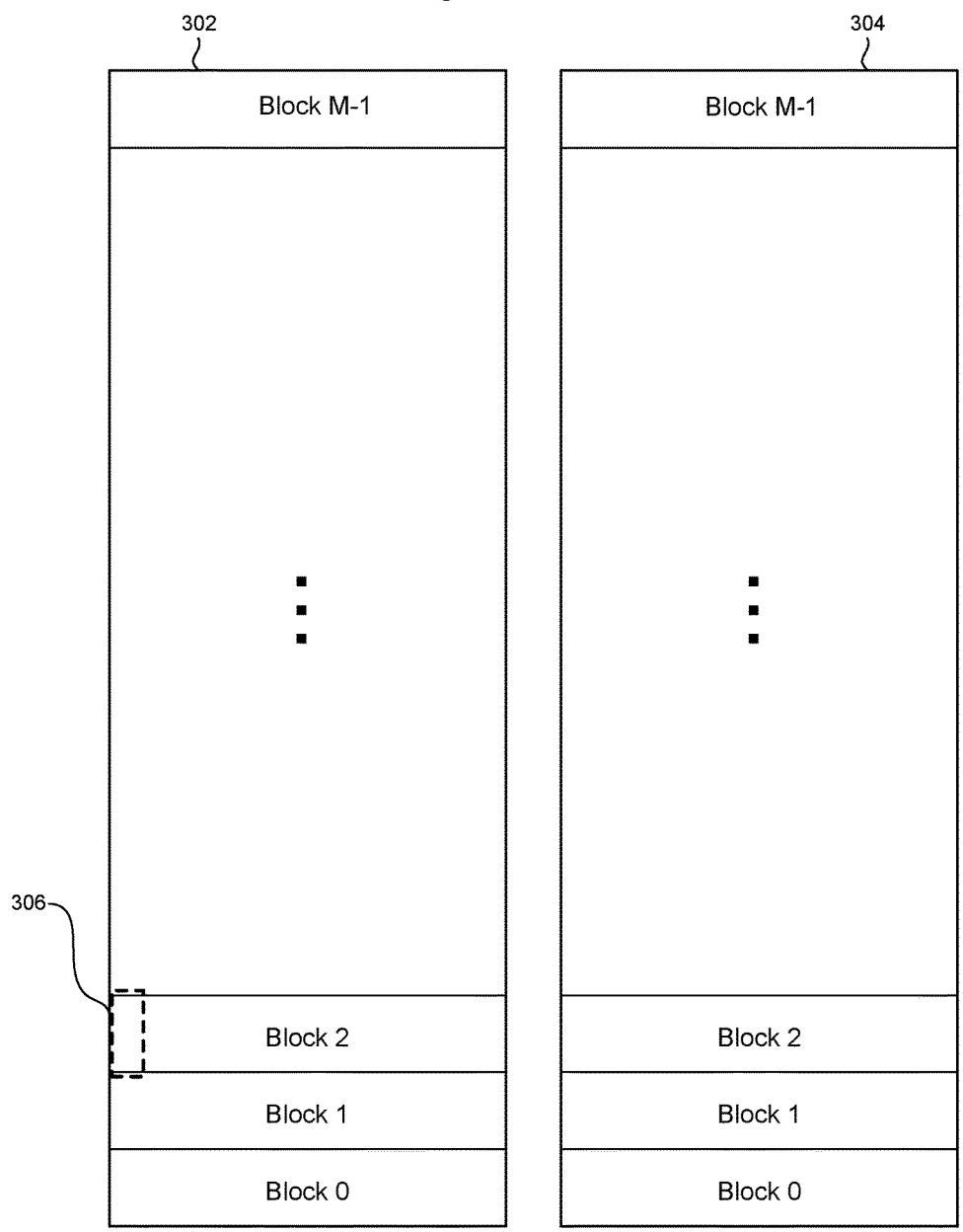

Fig. 4D
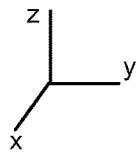
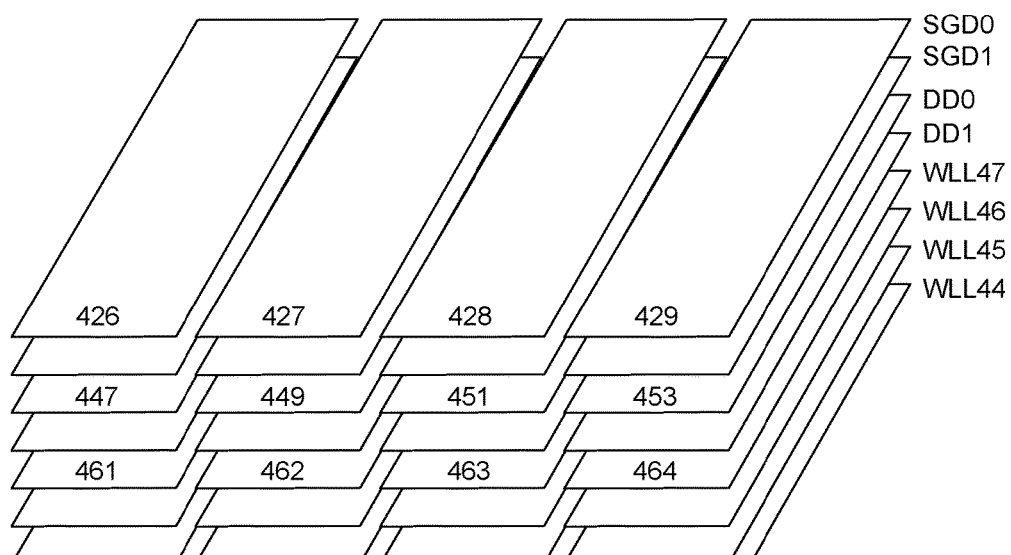
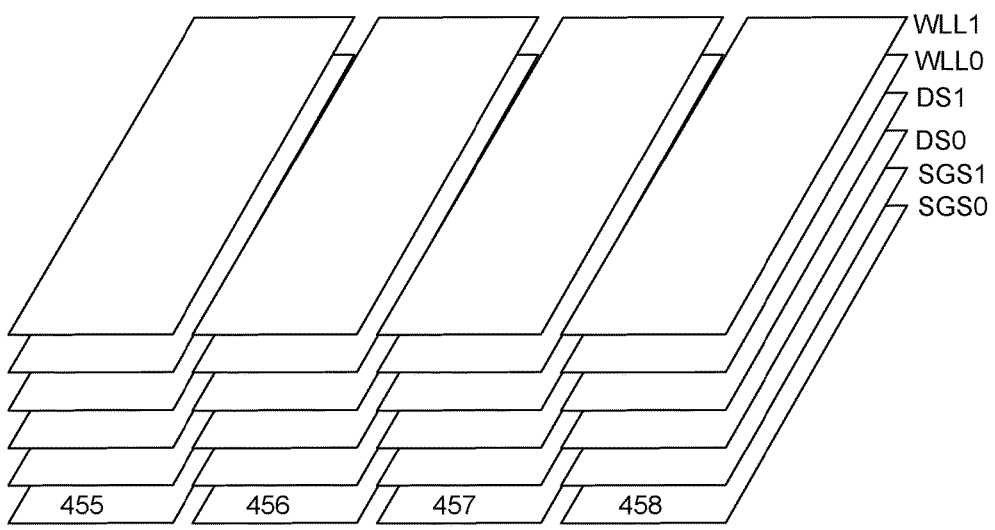

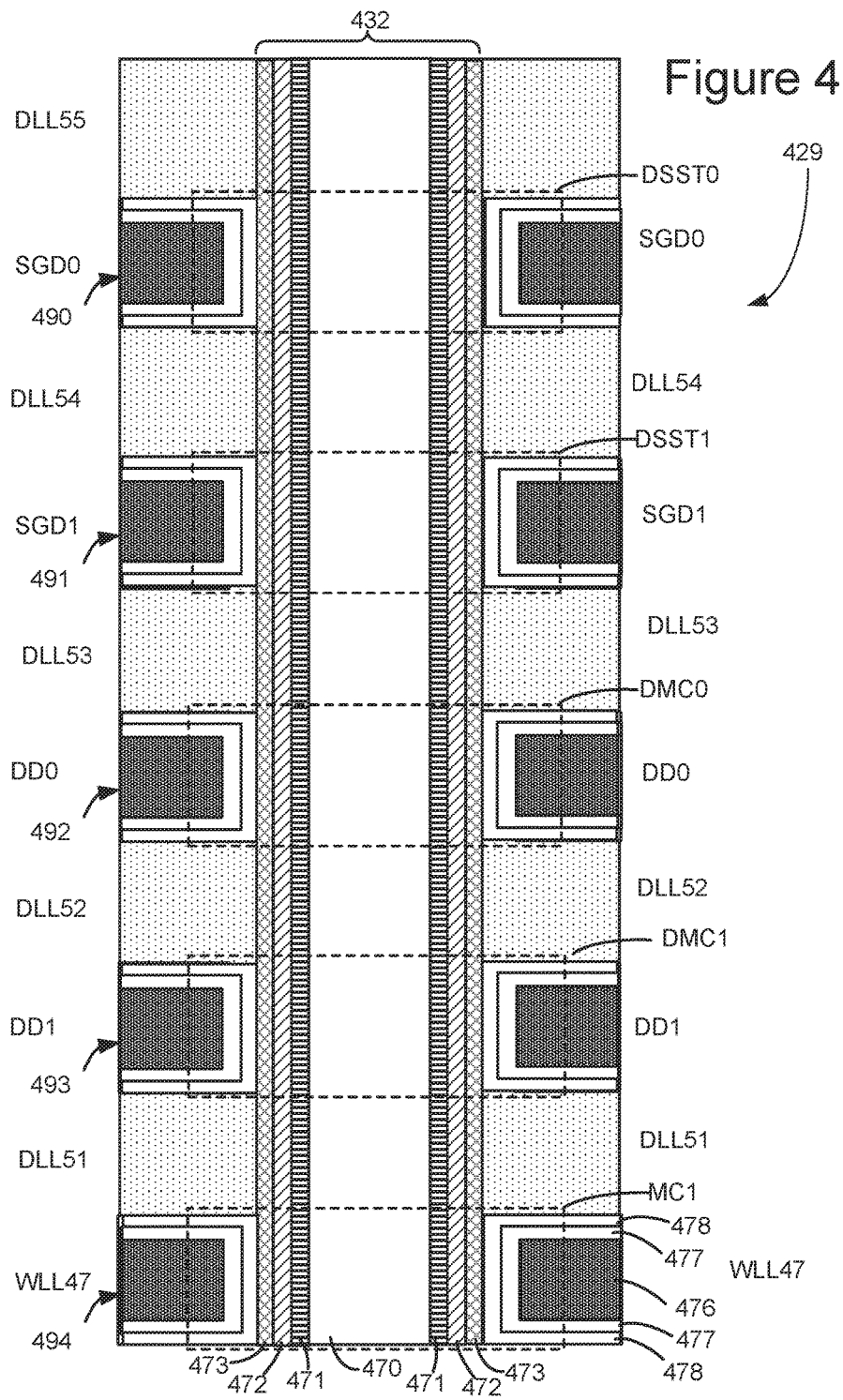

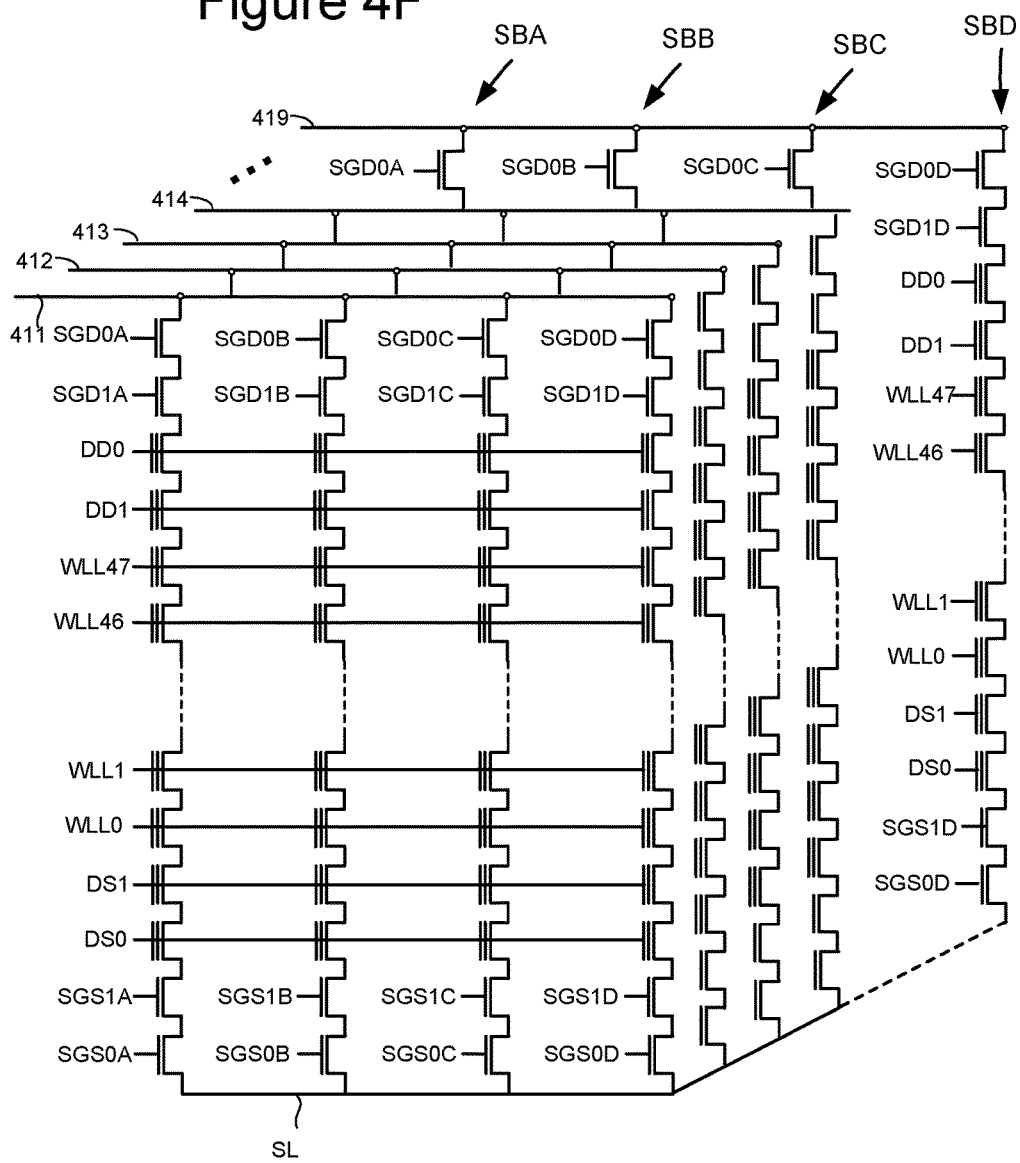

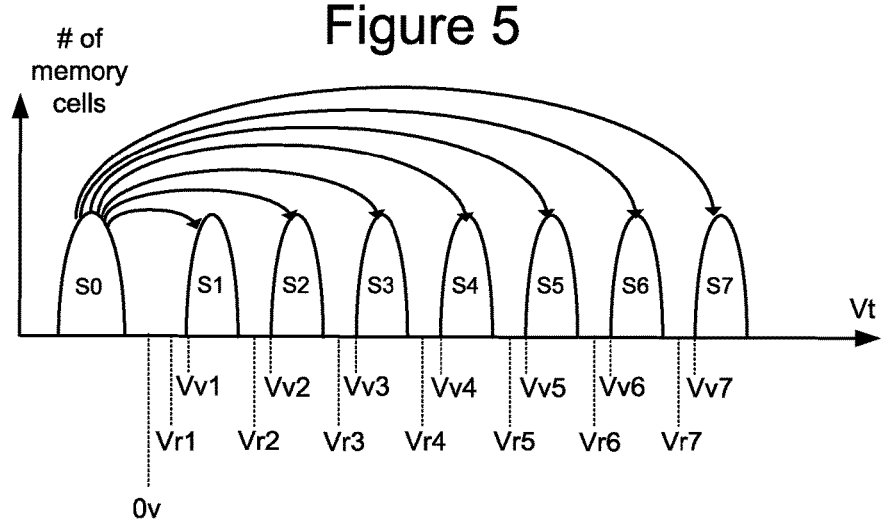

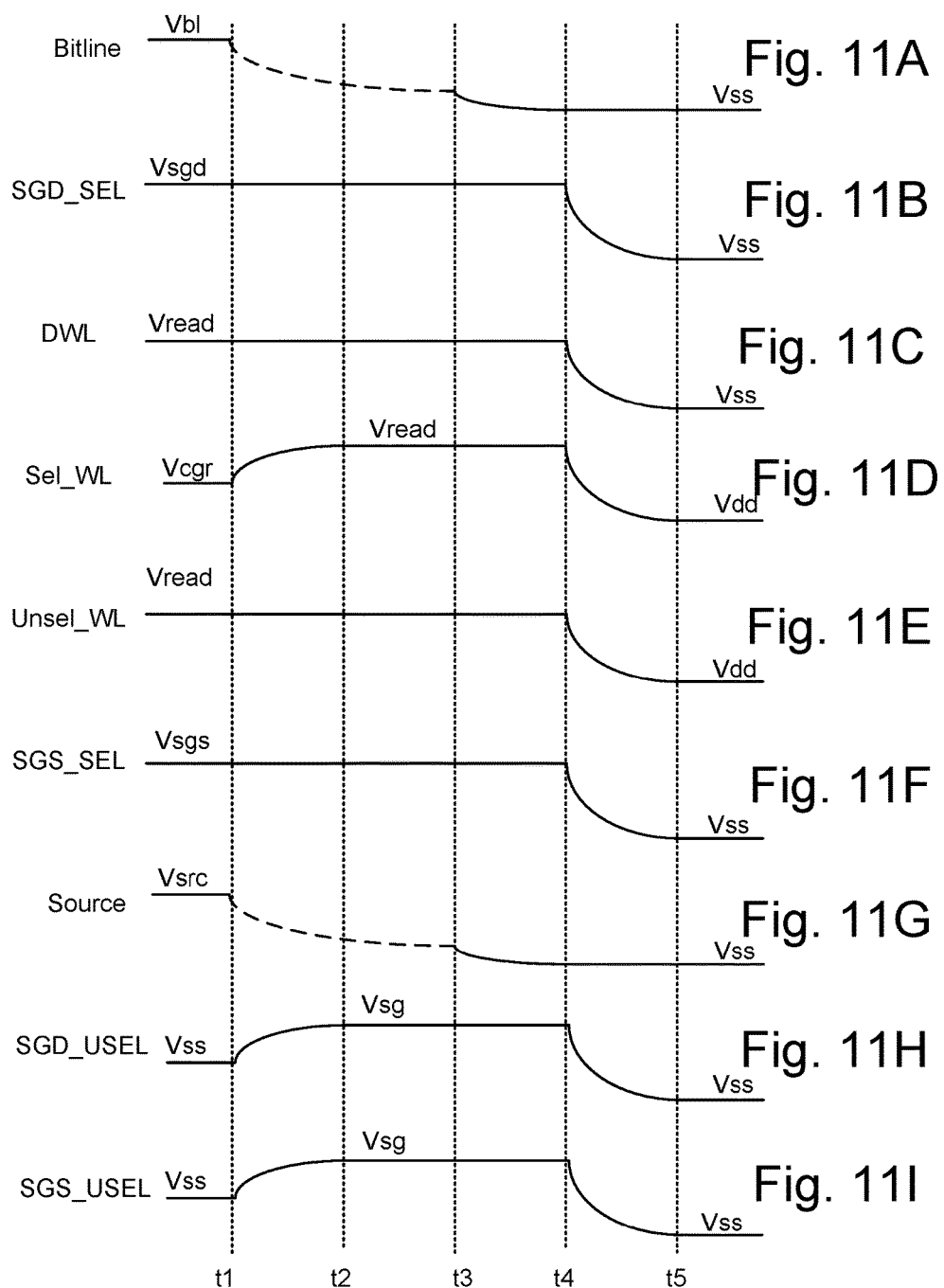

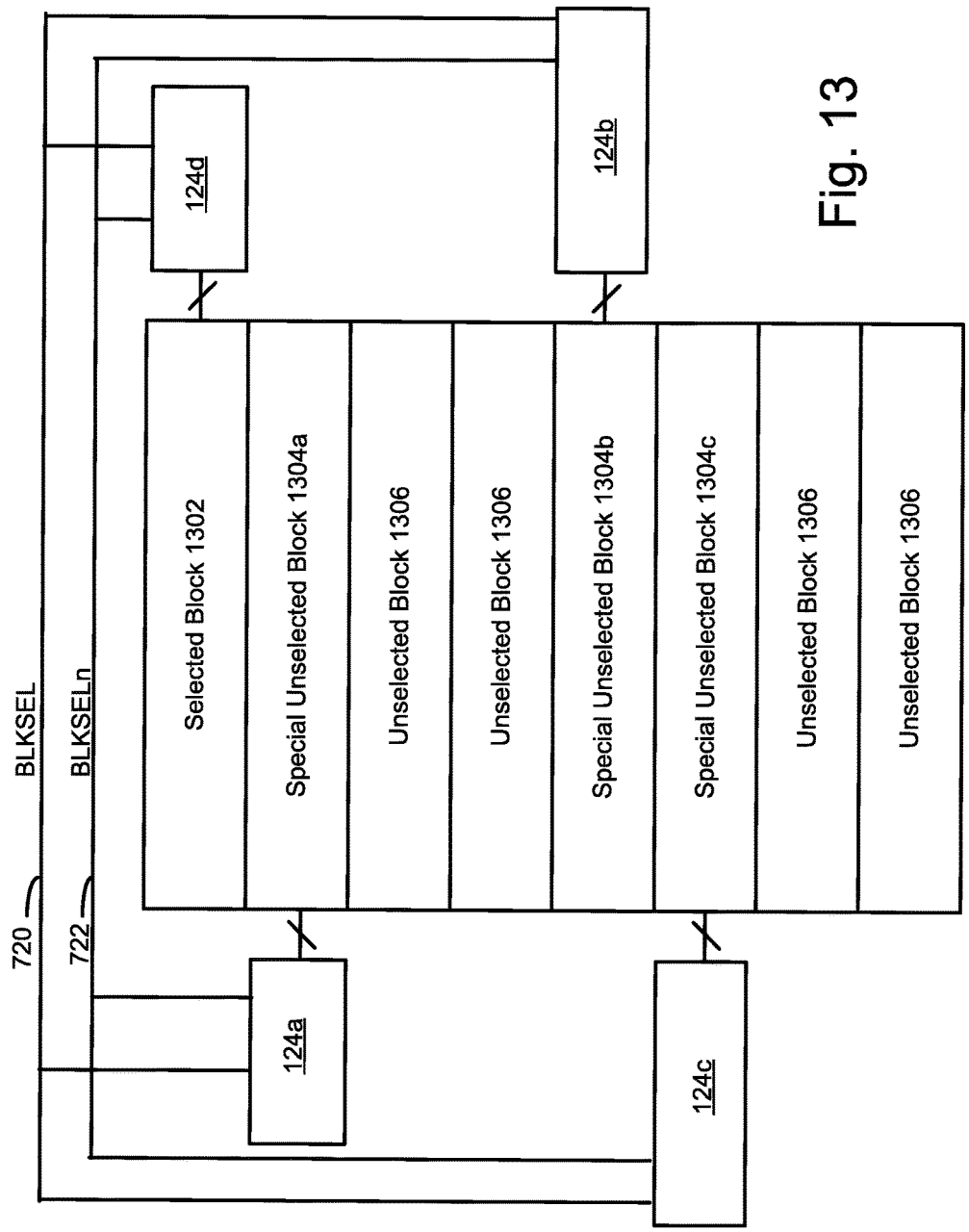

US 10,204,689 B1

NON-VOLATILE MEMORY WITH METHODS TO REDUCE CREEP-UP FIELD BETWEEN DUMMY CONTROL GATE AND SELECT GATE

CLAIM OF PRIORITY

The present application claims priority to U.S. Provisional Application No. 62/536,939, entitled "NON-VOLATILE MEMORY WITH METHODS TO REDUCE CREEP-UP FIELD BETWEEN DUMMY WORD LINE AND SELECT GATE," filed Jul. 25, 2017, which is herein incorporated by reference in its entirety.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. The data can then be read back and provided in response to read requests. It is important that data stored in a memory system is not lost. Performance of the memory system, such a speed of operation, is also important to hosts, clients, users, etc.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIG. 4E is a cross sectional view of a vertical column of memory cells.

FIG. 4F is a schematic of a plurality of NAND strings.

FIG. 5 depicts threshold voltage distributions.

FIGS. 11A-11I are timing diagrams of voltages that may be applied to various conductive lines in one embodiment of process 1000 of FIG. 10.

FIG. 13 is a block diagram of one embodiment in which a block select line is shared among a group of four blocks.

DETAILED DESCRIPTION

Non-volatile storage systems and methods of operating non-volatile storage systems are disclosed. In some embodiments disclosed herein, a crept up voltage on a dummy memory cell control gate adjacent to a select transistor is prevented, reduced, and/or discharged. In some embodiments, the crept up voltage is not allowed to happen on the dummy memory cell next to the select transistor after a sensing operation. In some embodiments, the voltage may creep up on the dummy memory cell control gate after a sensing operation, but the crept up voltage is discharged. Reducing and/or preventing the crept up voltage may reduce the electric field between the dummy memory cell and select transistor. This may prevent, or at least reduce, changes in threshold voltage of the select transistor. Additional problems may also be solved by a reduction of the crept up voltage on the dummy memory cell CGs. Likewise, additional problems may also be solved by a reduction of the electric field between the dummy memory cell and select transistor.

Some embodiments are practiced in a memory device in which memory cells have a charge storage region comprising a charge-trapping material such as silicon nitride or other nitride, etc. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films may include a charge-trapping layer which extends vertically along an individual cell or an entire NAND string, a tunneling layer and a channel layer. Some of the conductive layers are used as control gates (or word lines) for memory cells and other conductive layers are used as control gates for select gate transistors, such as drain or source-side transistors in NAND strings. In some embodiments, the charge-trapping material is used in memory cells in 2D NAND.

Figure 1A:
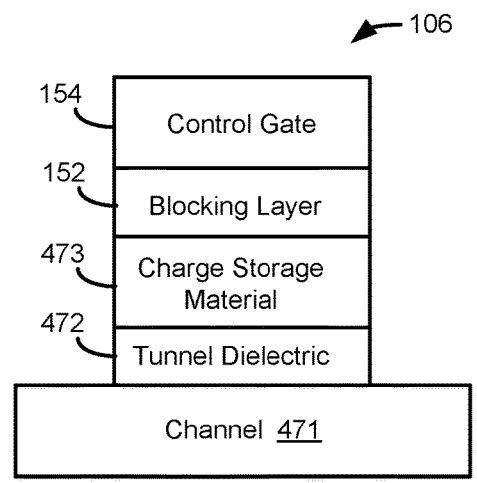
FIG. 1A shows a memory cell.

FIG. 1A shows a memory cell 106 having a control gate 154, dielectric blocking layer 152, charge storage region 473, tunnel dielectric layer 472, and channel 471. The memory cell may also be referred to as a "memory cell transistor," as it may operate as a transistor. The memory cell may be one of many memory cells on a string (e.g., NAND string). The string of memory cells may share the channel 471. The string of memory cells could be in a 3D memory array or a 2D memory array. A sensing operation may be used to determine a threshold voltage of an individual memory cell.

Figure 1B:
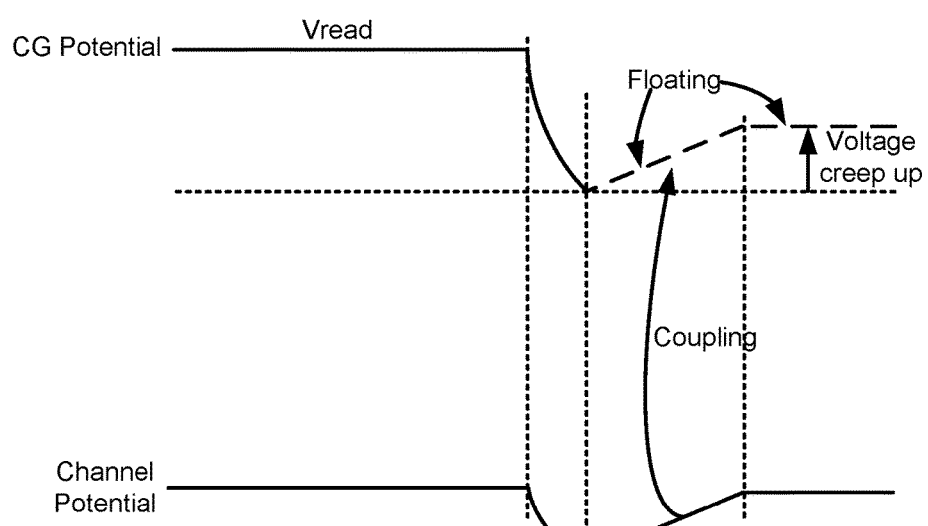
FIG. 1B shows a timing diagram of a voltage applied to memory cell control gates (CG) during a sensing operation, as well as the channel voltage.

FIG. 1B shows a timing diagram of a voltage applied to memory cell control gates (CG) during a sensing operation, as well as the channel voltage. The sensing operation could be, for example, a read or a program verify. The sensing operation typically includes applying a read pass voltage (e.g., Vread) to control gates of unselected memory cells on a string while applying a reference voltage (e.g., Vcgr) to the control gate of the memory cell that has been selected for sensing (e.g., "selected memory cell"). The unselected memory cells may include "dummy memory cells". A dummy memory cell does not store host data (data provided from the host, such as data from a user of the host), while a data memory cell is eligible to store host data.

The reference voltage might be a read reference voltages for a read operation, a verify voltage for a program verify operation, etc. In some embodiments, after the selected memory cell has been sensed, its control gate voltage is raised to a read pass voltage. Thus, all of the control gate of all of the memory cells on the string may be at the read pass voltage near the end of the sensing operation. A read pass voltage is a voltage that is sufficient to place the memory cell into a conductive state, assuming that its threshold voltage is within a range of threshold voltages assigned to different data states. It is not required that the read pass voltage have the same magnitude for all memory cells on the string, but that is one possibility.

During the sensing operation, various memory cells on the string may be in a conductive state. Hence, there may be electrons in the channel. As depicted in FIG. 1B, after sensing the selected memory cell, the control gate voltages may be discharged from the read pass voltage down to a lower voltage. This lower voltage could be at or near a steady state voltage (e.g., Vss). During this discharge, it is possible for some of the electrons to remain in some portions of the channel. As depicted in FIG. 1B, after the memory cell control gates have been discharged to the lower voltage, the memory cell control gates may be floated. It is possible for capacitive coupling between the channel and the memory cell control gates to cause the voltage on the memory cell control gates to creep up after the sensing operation.

Figure 1C:
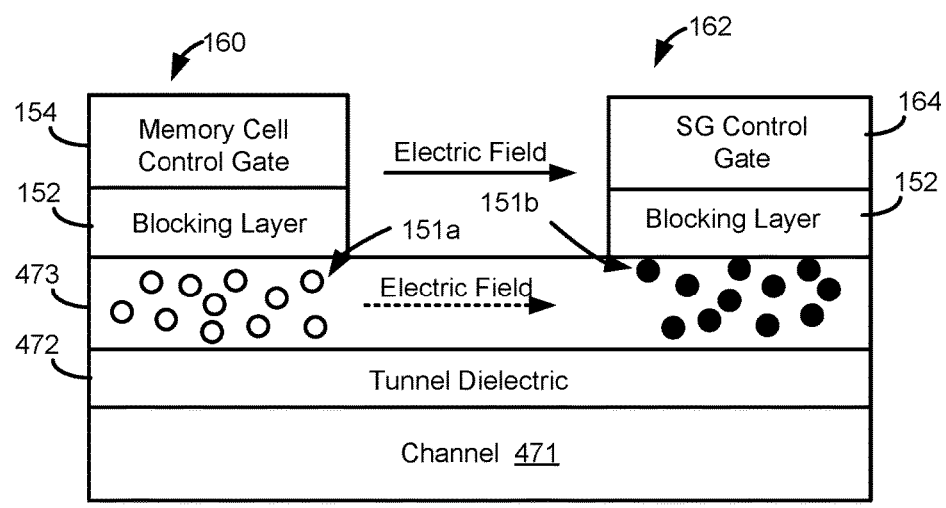
FIG. 1C shows a portion of a string of memory cells, having a select gate.

FIG. 1C shows a portion of a string of memory cells, having a select gate. FIG. 1C is used to illustrate a technological problem that could occur after sensing a memory cell on the string. FIG. 1C shows just one memory cell 160 and one select gate 162. Typically, there are many memory cells on string. In some cases, there is one select gate at each end of the string. In some architectures, these are referred to a drain select gate and a source select gate. Note that each select gate may include one or more transistors. In the example of FIG. 1C, the select gate 162 has a single transistor, and hence may alternatively be referred to as a select transistor 162. The string is a NAND string, in one embodiment.

In the example of FIG. 1C, the charge storage material 473 is a contiguous region shared by the memory cell 160 and select gate 162. FIG. 1C shows charges 151a in the charge storage material 473 adjacent to the memory cell control gate 154 and charges 151b in the charge storage material 473 adjacent to the select transistor control gate 164. The charges 151a adjacent to the memory cell control gate 154 are white to indicate that these charges may be holes. The threshold voltage of the memory cell transistor may be controlled by the amount of charge in the charge storage material 473 adjacent to the memory cell control gate. Likewise, the threshold voltage of the select transistor 162 may be controlled by the amount of charge in the charge storage material 473 adjacent to the select transistor control gate 164.

The charges 151b adjacent to the select transistor control gate 164 are black to indicate that these charges may be electrons. One possibility is for the memory cell next to the select gate to be in an erased state, although this is not required. In some cases, the memory cell next to the select gate is a dummy memory cell, which is typically not used to store data.

FIG. 1C depicts a case in which there is an electric field between the memory cell control gate 154 and select transistor control gate 164. One possible cause for the electric field is that the memory cell control gate 154 may be at a higher potential than the select transistor control gate 164. This condition could happen if the voltage on the memory cell control gate 154 were to creep up after a sensing operation, assuming that the select transistor control gate 164 is at a lower voltage than the crept up voltage. Note that the select transistor control gate 164 could be at some low potential, such as ground or close to ground, for proper operation.

This electric field may extend into the charge storage material 473, as indicated in FIG. 1C. The electric field could possibly lead to a reduction in the net charge in the charge storage material 473 adjacent to the select transistor control gate 164. For example, holes adjacent to the memory cell could possible move in the electric field to portion of the charge storage material 473 adjacent to the select transistor 162. Therefore, the threshold voltage of the select transistor 162 could be altered. For example, the threshold voltage of the select transistor 162 could be reduced. A reduction of the threshold voltage of the select transistor 162 could adversely impact performance of memory array operations. One possible adverse impact is that a technique that inhibits program of unselected strings might become less effective. Hence, memory cells on unselected strings might suffer program disturb.

In some embodiments disclosed herein, a crept up voltage on a memory cell control gate adjacent to a select transistor is either prevented, reduced, and/or discharged. In some embodiment, the crept up voltage is not allowed to happen on the memory cell next to the select transistor after a sensing operation. In some embodiment, the voltage may creep up on the memory cell CG, but it is discharged. Reducing and/or preventing the crept up voltage may reduce the electric field between the dummy memory cell and select transistor. Thus, aforementioned problems of adversely impacting the charge (and hence Vt) of the select transistor are reduced or avoided. Additional problems may also be solved by a reduction of the crept up voltage on the dummy memory cell CGs. Likewise, additional problems may also be solved by a reduction of the electric field between the dummy memory cell and select transistor.

Figure 2A:
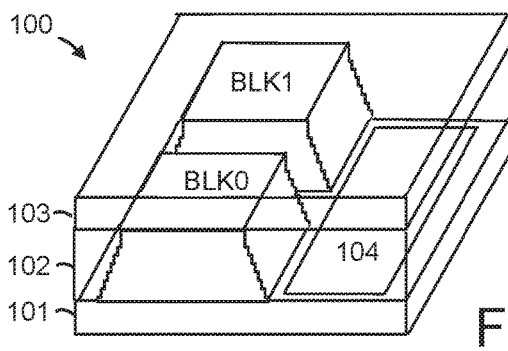
FIG. 2A is a perspective view of a 3D stacked non-volatile memory device.

FIGS. 2A-4F describe one example of a memory system that can be used to implement the technology proposed herein. FIG. 2A is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2B:
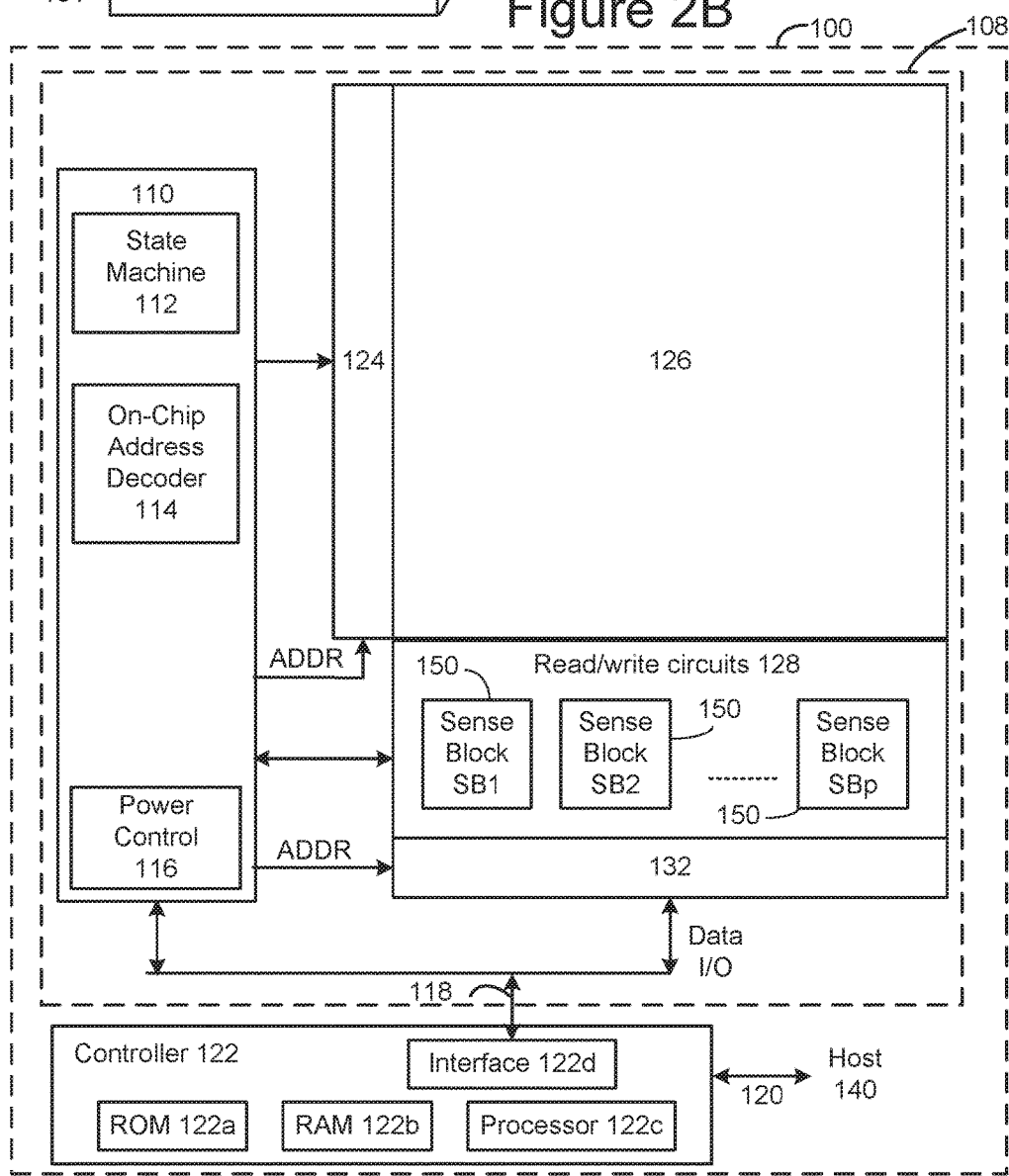
FIG. 2B is a functional block diagram of a memory device such as the 3D stacked non-volatile memory device 100 of FIG. 2A.

FIG. 2B is a functional block diagram of an example memory device such as the 3D stacked non-volatile memory device 100 of FIG. 2A. The components depicted in FIG. 2B are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, a power control module 116. The state machine 112 provides die-level control of memory operations. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write circuits 128, and controller 122 can be considered a control circuit that performs the functions described herein.

The (on-chip or off-chip) controller 122 (which in one embodiment is an electrical circuit) may comprise one or more processors 122c, ROM 122a, RAM 122b, Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122*d* can change the format or timing of signals, provide a buffer, isolate from surges, latch I/O, etc. Processor 122*c* can issue commands to control circuitry 110 (or any other component of memory die 108) via Memory Interface 122*d*.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
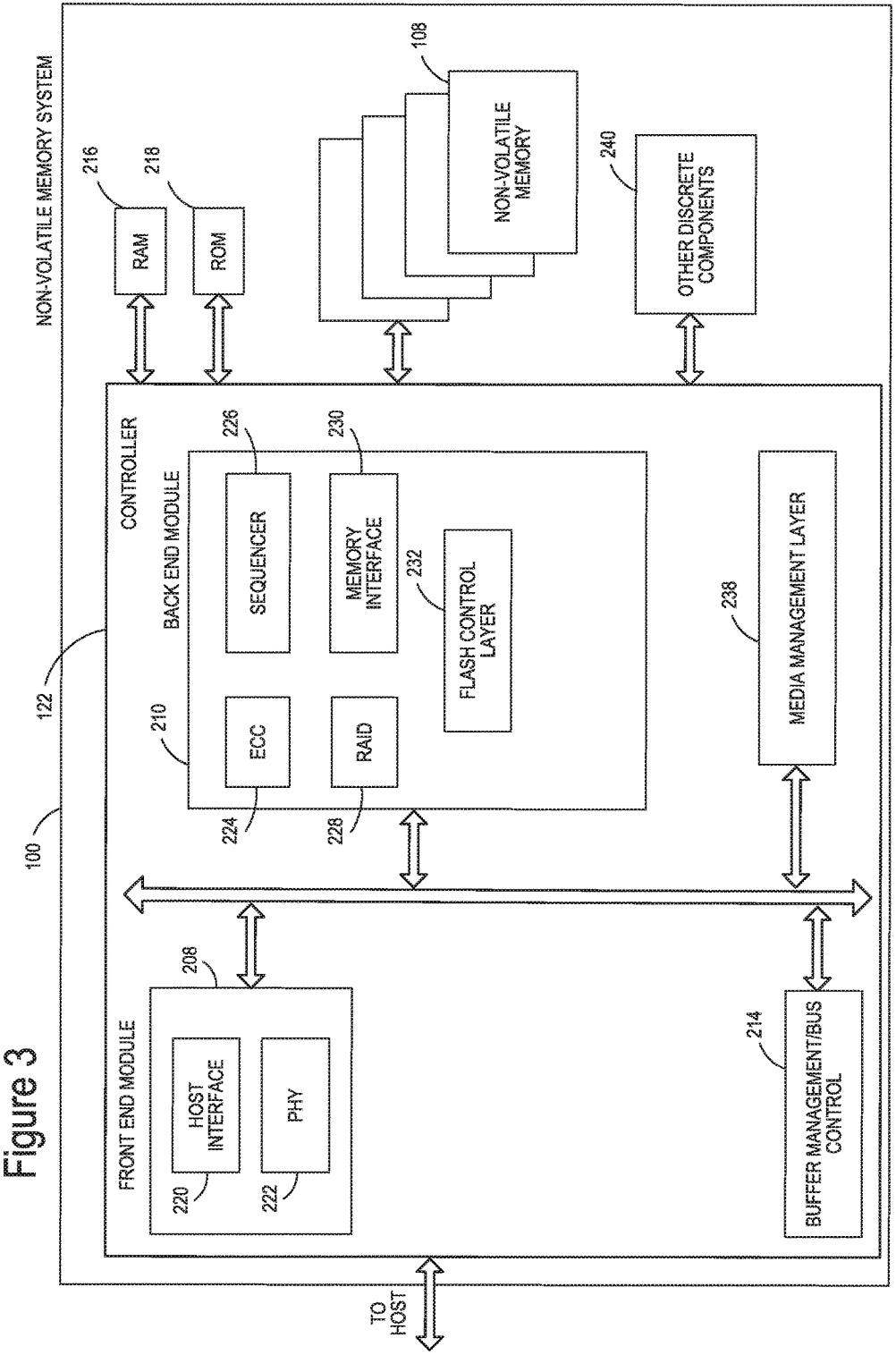
FIG. 3 is a block diagram depicting one embodiment of a memory system.

FIG. 3 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 122 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, laptop, tablet, etc. Additionally, the SSD need not be made to work as a hard drive.

Figure 3A:
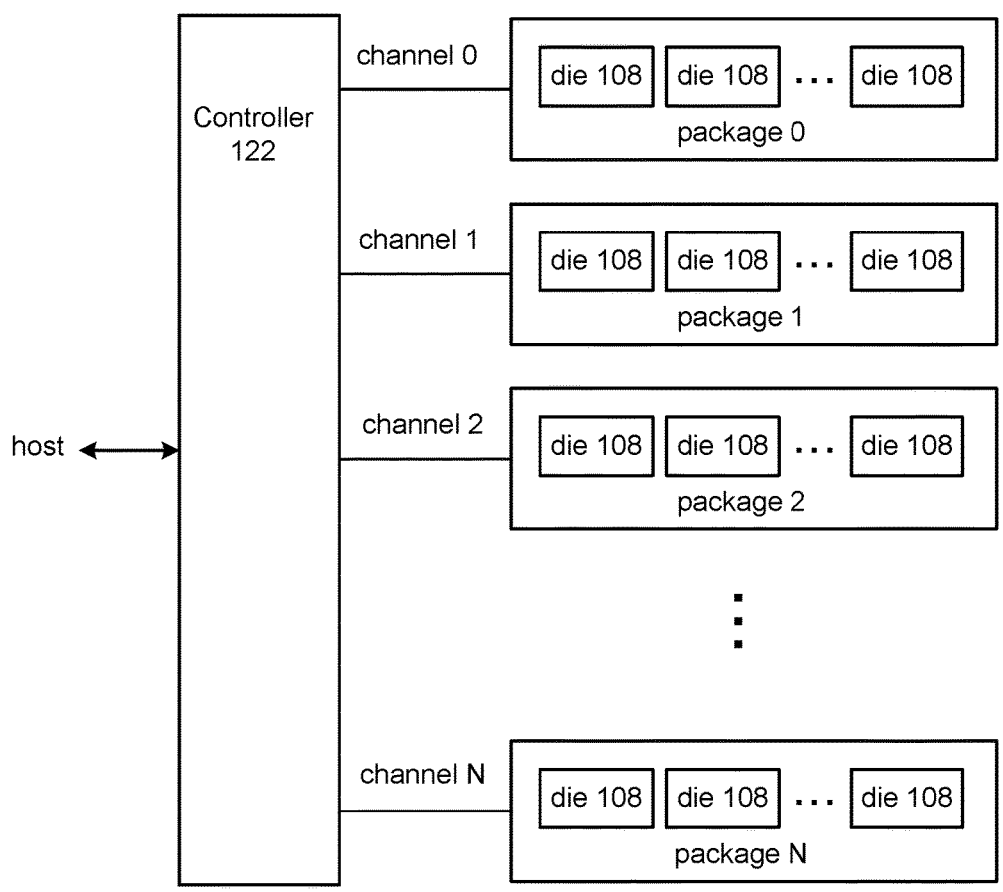
FIG. 3A is a block diagram depicting one embodiment of a memory system.

Some embodiments of a non-volatile storage system will include one memory die 108 connected to one controller 122. However, other embodiments may include multiple memory die 108 in communication with one or more controllers 122. In one example, depicted in FIG. 3A, the multiple memory die can be grouped into a set of memory packages. Each memory package includes one or more memory die in communication with controller 122. FIG. 6 shows N+1 memory packages (package 0-package N), and N+1 channels (channel 0-channel N) for communication between controller 122 and the memory dies 108 of respective memory packages 0-N. In one embodiment, a memory package includes a printed circuit board (or similar structure) with one or more memory die 108 mounted thereon. In some embodiments, a memory package can include molding material to encase the memory dies 108 of the memory package. In one embodiment, a memory package can be a single memory die 108. In some embodiments, controller 122 is physically separate from any of the memory packages.

Figure 4:
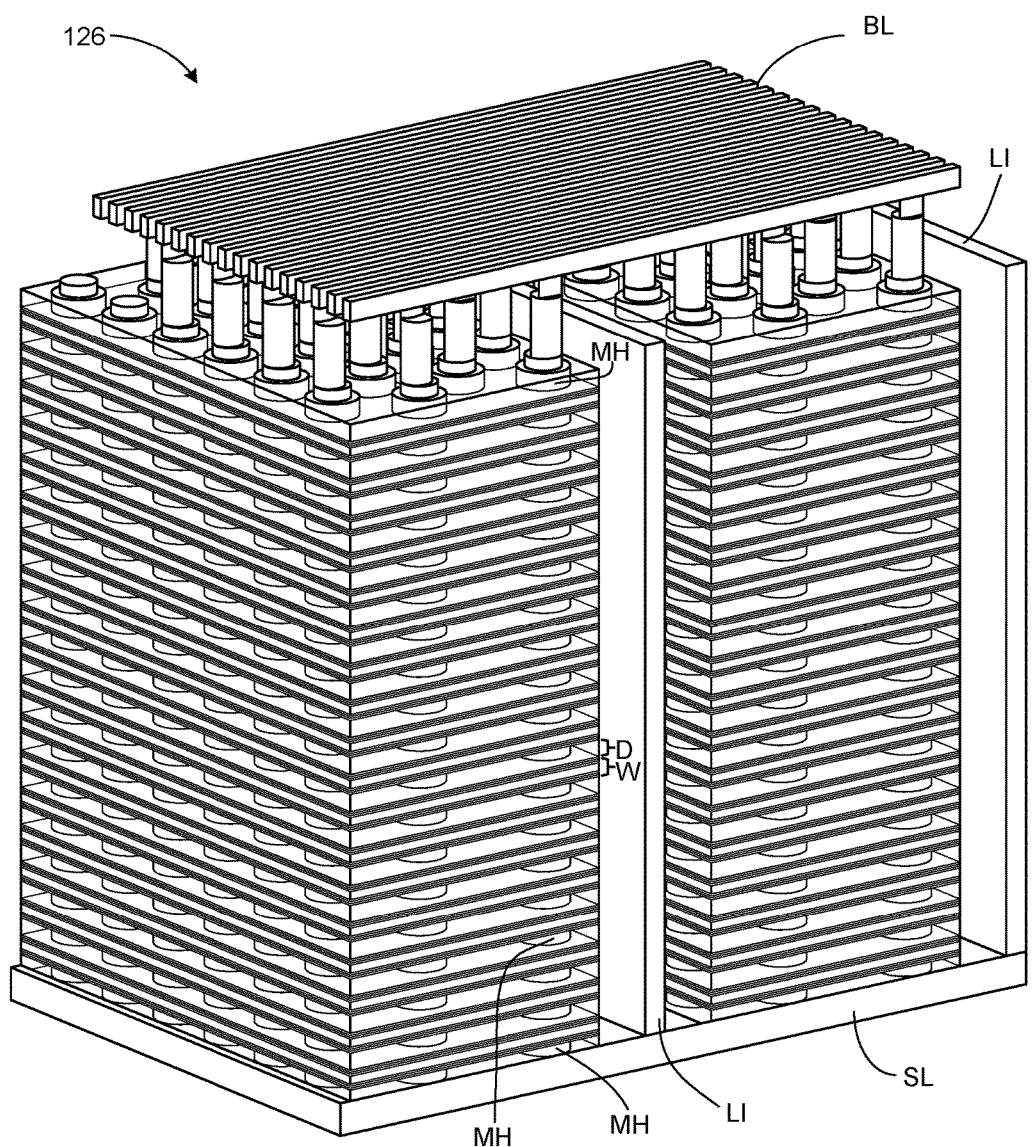
FIG. 4 is a perspective view of a portion of one embodiment of a monolithic three dimensional memory structure.

FIG. 4 is a perspective view of a portion of one example embodiment of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
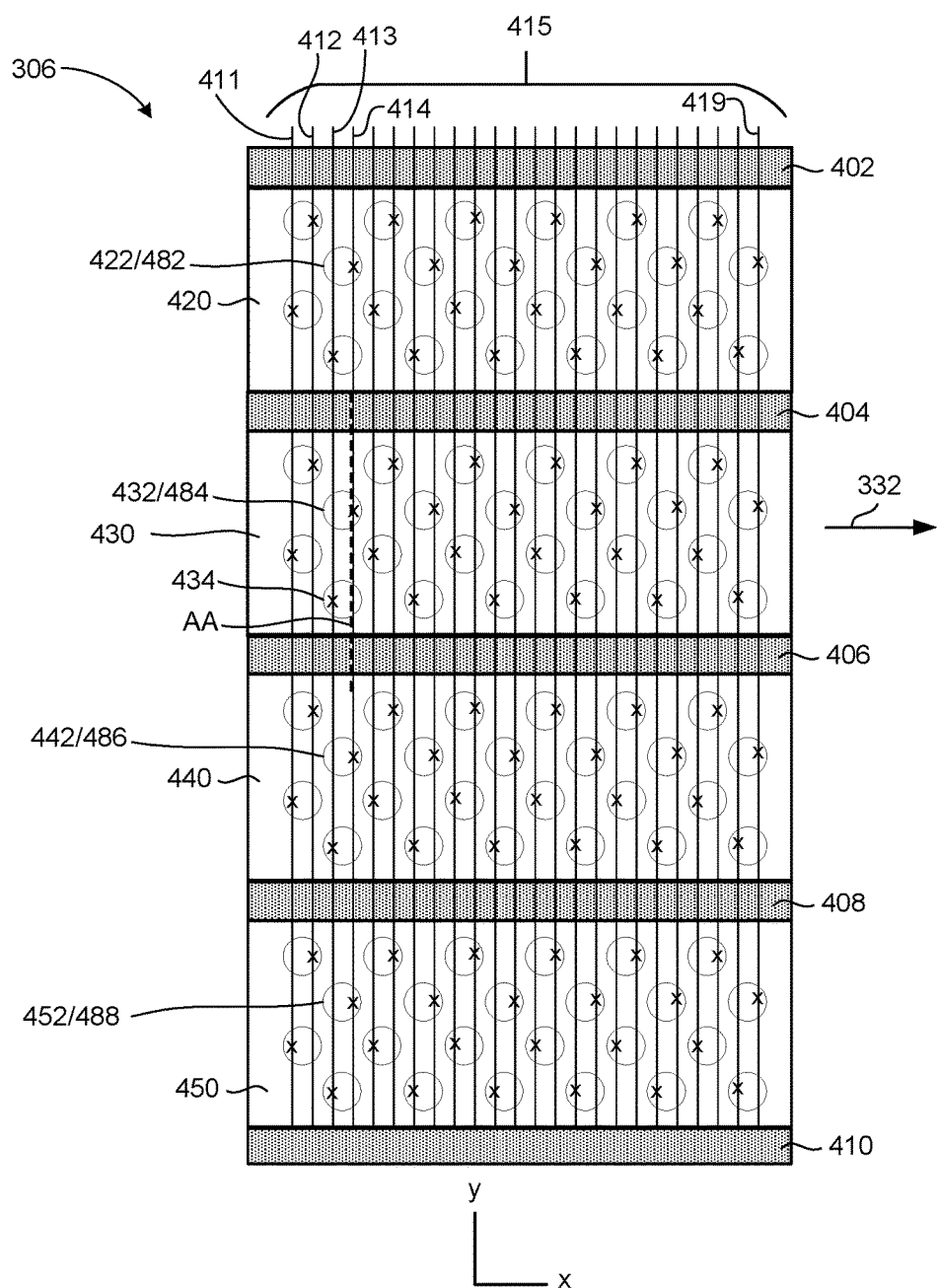
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
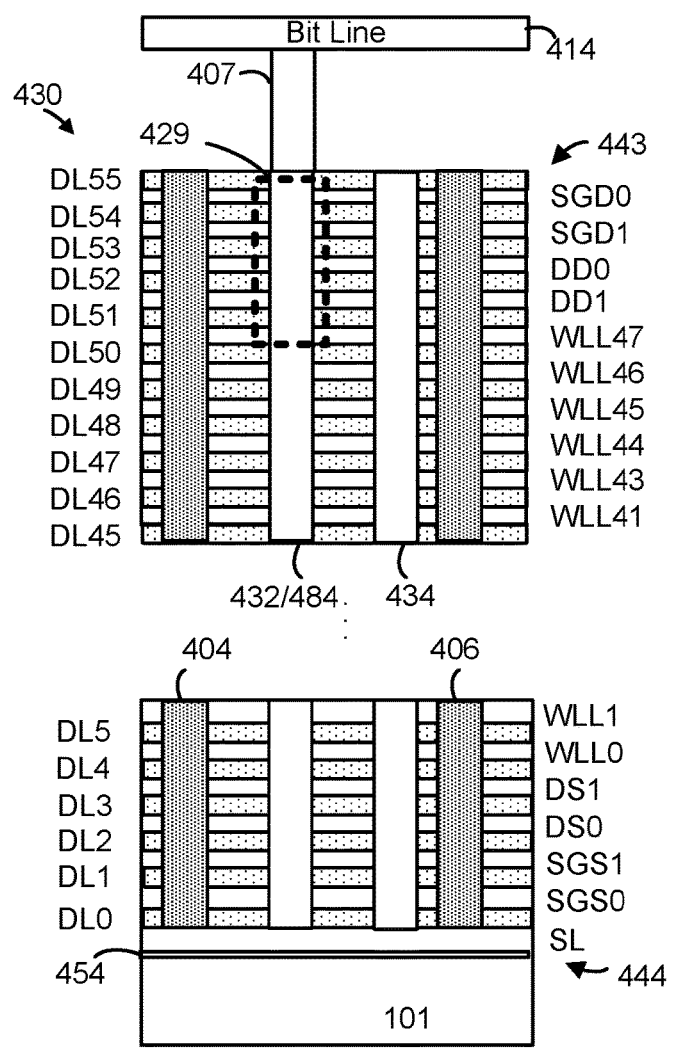
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes two drain side select layers SGD0 and SGD1; two source side select layers SGS0 and SGS1; four dummy word line layers DD0, DD1, DS0 and DS1; and forty eight data word line layers WLL0-WLL47 for connecting to data memory cells. Other embodiments can implement more or fewer than two drain side select layers, more or fewer than two source side select layers, more or fewer than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 407. Local interconnects 404 and 406 are also depicted.

For ease of reference, drain side select layers SGD0 and SGD; source side select layers SGS0 and SGS1; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL55. For example, dielectric layers DL47 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4D depicts a logical representation of the conductive layers (SGD0, SGD1, SGS0, SGS1, DD0, DD1, DS0, DS1, and WLL0-WLL47) for the block that is partially depicted in FIG. 4C. The SGD layers SGD0 and SGD0 each includes parallel rows of select gate lines associated with the drain-side of a set of NAND strings. For example, SGD0 includes drain-side select gate regions 426, 427, 428 and 429. As mentioned above with respect to FIG. 4B, in one embodiment local interconnects 402, 404, 406, 408 and 410 break up each conductive layers into four regions or fingers. In one embodiment, the four select gate regions on a same level are connected together. In another embodiment, each select gate region operates as a separate select line.

Below the SGD layers are the drain-side dummy word line layers. Each dummy word line layer represents a word line, in one approach, and is connected to a set of dummy memory cells at a given height in the stack. For example, DD0 comprises word line layer regions 447, 449, 451 and 453. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy word line layers are the data word line layers. For example, WLL47 comprises word line layer regions 461, 462, 463 and 464, consistent with FIG. 4A. Below the data word line layers are the source-side dummy word line layers DS1 and DS0.

Below the source-side dummy word line layers are the SGS layers. The SGS layers SGS0 and SGS1 each includes parallel rows of select gate lines associated with the source-side of a set of NAND strings. For example, SGS0 includes source-side select gate lines 455, 456, 457 and 458. Each select gate line can be independently controlled, in one approach. Or, the select gate lines can be connected and commonly controlled.

FIG. 4E depicts a cross sectional view of region 429 of FIG. 4C that includes a portion of vertical column 432. In one embodiment, the vertical columns are round and include four layers; however, in other embodiments more or fewer than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL51, DLL52, DLL53, DLL54, and DLL55, as well as word line layer WLL47, dummy word line layers DD0 and DD1, and drain side select layers SGD0 and SGD1. Each of the conductive layers (WLL47, DD0, DD1, SGD0, and SGD1) includes a conductive region 476 surrounded by an aluminum oxide layer 477, which is surrounded by a blocking oxide ($SiO_2$) layer 478. Note that the portion of a conductive layers that is adjacent the vertical column 432 may be considered to be a control gate 154 of a memory cell 160 or control gate 164 of a select gate 162. Aluminum oxide layer 477 and/or blocking oxide ($SiO_2$) layer 478 are one example of blocking layer 152. The physical interaction of the word line layers with the vertical column forms the memory cells and select gate. Thus, a memory cell, in one embodiment, comprises channel 471, tunneling dielectric 472, charge trapping layer 473, blocking oxide layer 478, aluminum oxide layer 477 and word line region 476. For example, a portion of word line layer WLL47 and a portion of vertical column 432 comprise a memory cell MC1. A portion of dummy word line layer DD1 and a portion of vertical column 432 comprise a dummy memory cell DMC1. A portion of dummy word line layer DD0 and a portion of vertical column 432 comprise a dummy memory cell DMC0. In one embodiment, a portion of conductive layer SGD1 and a portion of vertical column 432 comprise a drain side select transistor DSST1. In one embodiment, a portion of conductive layer SGD0 and a portion of vertical column 432 comprise a drain side select transistor DSST0. In some embodiments, conductive layers SGD1 and SGD0 are electrically connected (connected not depicted in FIG. 4E). In other architectures, a select gates and memory cells may have a different structure.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell may be increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Note that both data and dummy memory cells may be programmed. In some embodiments, the dummy memory cells are erased, and stay in the erased state during operation of the memory array. Hence, dummy memory cells could have a low threshold voltage. Moreover, the dummy memory cells could have a significant number of holes in their charge trapping layer.

Also note that the select gate transistors can also be programmed in a manner similar to programming the memory cells. In some embodiments, the select gate transistors are programmed to have a target threshold voltage for optimal memory array operation. Embodiments disclosed herein prevent or reduce undesired changes in the threshold voltages of the select gate transistors.

FIG. 4F shows physical word lines WLL0-WLL47 running across the entire block. Physical dummy word lines DD0 and DD1 also run across the entire block. The structure of FIG. 4F corresponds to portion 306 in Block 2 of FIGS. 4A-4B, including bit lines 411, 412, 413, 414, . . . 419. Within the block, each bit line connects to four NAND strings. Drain side selection lines SGD are used to determine which of the four NAND strings connect to the associated bit line. The block can also be thought of as divided into four sub-blocks SBA, SBB, SBC and SBD.

Sub-block SBA corresponds to those vertical NAND strings controlled by SGD0A, SGD1A, SGS1A and SGS0A. Note that SGD0A and SGD1A may have the same voltages applied thereto. For example, SGD0A and SGD1A may be connected electrically (although this is not required). Likewise, SGS0A and SGS1A may have the same voltages applied thereto. For example, SGS0A and SGDSA may be connected electrically (although this is not required).

Sub-block SBB corresponds to those vertical NAND strings controlled by SGD0B, SGD1B, SGS1B and SGS0B. Note that SGD0B and SGD1B may have the same voltages applied thereto. For example, SGD0B and SGD1B may be connected electrically (although this is not required). Likewise, SGS0B and SGS1B may have the same voltages applied thereto. For example, SGS0B and SGDSB may be connected electrically (although this is not required).

Sub-block SBC corresponds to those vertical NAND strings controlled by SGD0C, SGD1C, SGS1C and SGS0C. Note that SGD0C and SGD1C may have the same voltages applied thereto. For example, SGD0C and SGD1C may be connected electrically (although this is not required). Likewise, SGS0C and SGS1C may be controlled together. For example, SGS0C and SGDSC may be connected electrically (although this is not required).

Sub-block SBD corresponds to those vertical NAND strings controlled by SGD0D, SGD1D, SGS1D and SGS0D. Note that SGD0D and SGD1D may have the same voltages applied thereto. For example, SGD0D and SGD1D may be connected electrically (although this is not required). Likewise, SGS0D and SGS1D may be controlled together. For example, SGS0D and SGS1D may be connected electrically (although this is not required).

Note that each SGD0A may correspond to region 426 in FIG. 4D. Likewise, each SGD0B may correspond to region 427 in FIG. 4D. Likewise, each SGD0C may correspond to region 428 in FIG. 4D. Likewise, each SGD0D may correspond to region 429 in FIG. 4D. Note that each SGS0A may correspond to region 454 in FIG. 4D. Likewise, each SGS0B may correspond to region 455 in FIG. 4D. Likewise, each SGS0C may correspond to region 456 in FIG. 4D. Likewise, each SGS0D may correspond to region 457 in FIG. 4D.

Additionally note that various memory cells are depicted has having two "gates" in the schematic diagram of FIG. 4F. One of the memory cell gates is a control gate 154, the other "gate" refers to the charge trapping region 473. The select transistors are depicted as having a single gate (e.g., control gate 164) to help show the distinction between the select gates and memory cells. Note that the select transistors may also have a charge trapping region. Moreover, this charge trapping material could be shared with the memory cells. For example, FIG. 1C shows charge trapping material 473 as a contiguous region shared by the memory cell 160 and select gate 162. Likewise, FIG. 4E depicts charge trapping material 473 as a contiguous region shared by the data memory cell MC1, dummy memory cells DMC1, DMC2, and select gate transistors SGD1, SGD0.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

Figure 6A:
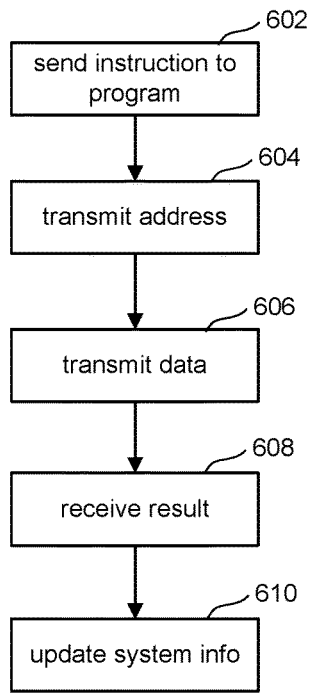
FIG. 6A is a flow chart describing one embodiment of a process for programming.

FIG. 6A is a flowchart describing one embodiment of a process for programming that is performed by controller 122. In some embodiments, rather than have a dedicated controller, the host can perform the functions of the controller. In step 602, controller 122 sends instructions to one or more memory die 108 to program data. In step 604, controller 122 sends one or more addresses to one or more memory die 108. The one or more logical addresses indicate where to program the data. In step 606, controller 122 sends the data to be programmed to the one or more memory die 108. In step 608, controller 122 receives a result of the programming from the one or more memory die 108. Example results include that the data was programmed successfully, an indication that the programming operation failed, and indication that the data was programmed but at a different location, or other result. In step 610, in response to the result received in step 608, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 602, controller 122 would receive host data and an instruction to program from the host, and the controller would run the ECC engine 224 to create code words from the host data, as known in the art and described in more detail below. These code words are the data transmitted in step 606. Controller can also scramble the data to achieve wear leveling with respect to the memory cells.

Figure 6B:
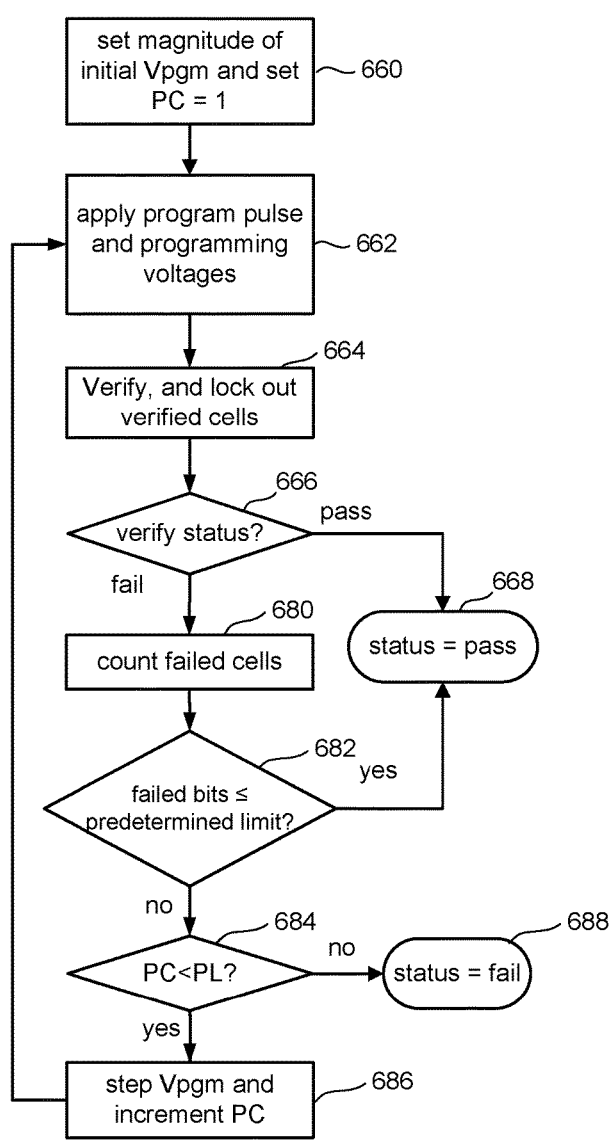
FIG. 6B is a flow chart describing one embodiment of a process for programming.

FIG. 6B is a flowchart describing one embodiment of a process for programming. The process of FIG. 6B is performed by the memory die in response to the steps of FIG. 6A (i.e., in response to the instructions, data and addresses from controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of FIG. 6B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 660 of FIG. 6B, the programming voltage (Vpgm) is initialized to the starting magnitude (e.g., ~12-16V or another suitable level) and a program counter PC maintained by state machine 112 is initialized at 1. In step 662, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~6-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 662, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 664, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 666, it is determined whether all the memory cells have reached their target threshold voltages (pass). If so, the programming process is complete and successful because all selected memory cells were programmed and verified to their target states. A status of "PASS" is reported in step 668. If, in 666, it is determined that not all of the memory cells have reached their target threshold voltages (fail), then the programming process continues to step 680.

In step 680, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 682, it is determined whether the count from step 680 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 668. In this situation, enough memory cells programmed correctly such that the few remaining memory cells that have not been completely programmed can be corrected using ECC during the read process. In some embodiments, step 680 will count the number of failed cells for each sector, each target data state or other unit, and those counts will individually or collectively be compared to a threshold in step 682.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 684 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 688. This is one example of a program fault. If the program counter PC is less than the program limit value PL, then the process continues at step 686 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 686, the process loops back to step 662 and another program pulse is applied to the selected word line so that another iteration (steps 662-686) of the programming process of FIG. 6B is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units.

Figure 7A:
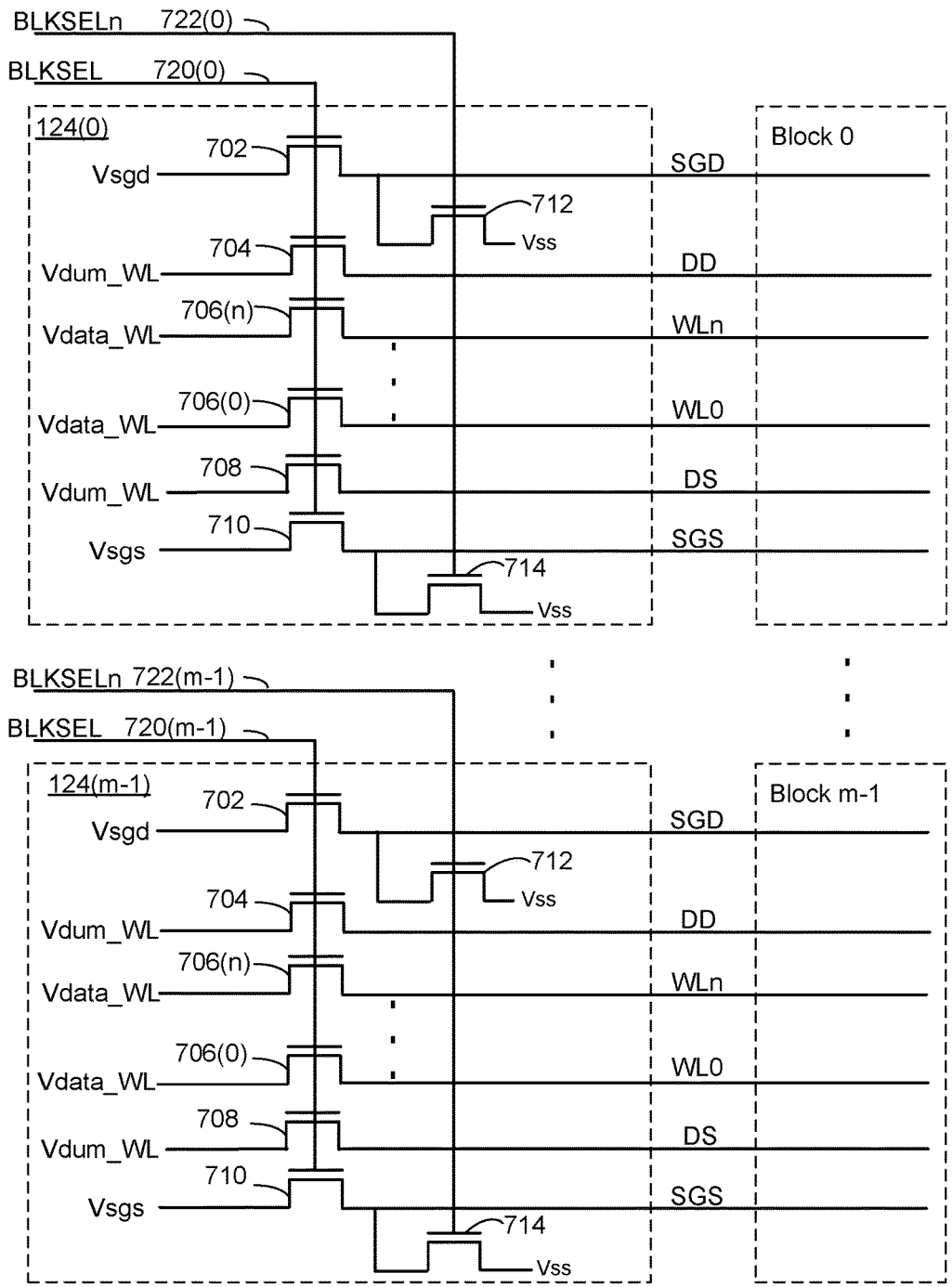
FIG. 7A is a simplified schematic diagram of one embodiment of a row decoder.

FIG. 7A is a simplified schematic diagram of one embodiment of a row decoder 124 that provides voltages to blocks (Block 0 . . . Block m-1) of memory cells. These blocks may be all in the same plane, as in the example of FIG. 4A. Each block has a number of conductive lines (SGD, DD, WLL0-WLLn, DS, and SGS). The conductive lines are a simplification of some of the architectural examples presented herein. Note that term "line" is being used because of the common use of the terms "select line" and "word line." However, it will be appreciated that the conductive "lines" are not limited to a geometric line, but may have a variety of geometric shapes. The conductive lines could alternatively be referred to as conductive regions. The row decoders 124 have transistors 702, 704, 706, 708, 710, 712, 714 to provide voltages to the conductive lines. By providing the voltages to the conductive lines, the voltages are provided to control gates of data memory cells, dummy memory cells, and select transistors, as the case may be.

A pair of block select lines (BLKSEL 720, BLKSELn 722) are used to control the transistors 702-714. In this example, one pair of block select lines (BLKSEL 720, BLKSELn 722) are associated with each block. Note that in some embodiments one pair of block select lines could be associated with multiple blocks. One such embodiment will be discussed below. In some embodiments, BLKSEL 720 and BLKSELn 722 are complementary signals. To select a block, BLKSEL 720 may be high and BLKSELn 722 may be low. For an unselected block, BLKSEL 720 may be low and BLKSELn 722 may be high. For example, to select Block 0, BLKSEL 720(0) may be high and BLKSELn 722(0) may be low. To unselect Block m-1, BLKSEL 720(m-1) may be low and BLKSELn 722(m-1) and may be high. Note that typically only one block in a plane is selected at a time.

To provide select gate voltage Vsgd to conductive line SGD, BLKSEL 720 may be used to turn on drain select gate (or select line) switch transistor 702, while providing Vsgs to the drain of switch transistor 702. At the same time, BLKSELn 722 may be used to turn off drain select gate switch transistor 712. As noted, SGD is a simplification of architectural examples presented herein. SGD could represent SGD0 or SGD1 in FIG. 4C or 4D. As another example, SGD could represent SGD0A, SGD0B, SGD0C or SGD0D in FIG. 4F. In some embodiments, one select gate line (in a selected block) is selected, while others (in the selected block) are unselected. For example, with reference to FIG. 4F, SDG0A can be selected while SDG0B, SDG0C, and SDG0D are unselected. At the same time, SDG1A can be selected while SDG1B, SDG1C, and SDG1D are unselected. Thus, a row decoder 124 could have additional switch transistors 702 to provide other select gate voltages Vsgd to other select gate lines in a block.

To provide dummy word line voltage Vdum_WL to conductive line DD, BLKSEL 720 may be used to turn on drain dummy word line switch transistor 704, while providing Vdum_WL to the drain of switch transistor 704. The drain dummy word line switch transistor 704 may also be referred to as a drain dummy control gate switch transistor 704, or more briefly as drain dummy switch transistor 704. Conductive line DD could represent dummy word line layer DD0 or DD1, with respect to FIGS. 4C-4F. To provide dummy word line voltage Vdum_WL to conductive line DS, BLKSEL 720 may be used to turn on source dummy switch transistor 708, while providing Vdum_WL to the drain of switch transistor 708. Conductive line DS could represent dummy word line layer DS0 or DS1, with respect to FIGS. 4C-4F.

To provide data word line voltage Vdata_WL to one of conductive lines WL0-WLn, BLKSEL 720 may be used to turn on data word line switch transistors 706(0)-706(n), while providing Vdata_WL to the respective drains of switch transistors 706(0)-706(n). The data word line switch transistors 706 may also be referred to as data control gate switch transistors 706, or more briefly as data switch transistors 706. The magnitude of Vdata_WL can be different for the different data word lines. Conductive lines WL0-WLn could represent word line layers WLL0-WLL47, with respect to FIGS. 4C-4F.

To provide select gate voltage Vsgs to conductive line SGS, BLKSEL 720 may be used to turn on source select gate (or select line) switch transistor 710, while providing Vsgs to the drain of switch transistor 710. At the same time, BLKSELn 722 may be used to turn off source select switch transistor 714. SGS could represent SGS0 or SGS1 in FIG. 4C or 4D. As another example, SGS could represent SGS0A, SGS0B, SGS0C or SGS0D in FIG. 4F. In some embodiments, one select gate line (in a selected block) is selected, while others (in the selected block) are unselected. For example, with reference to FIG. 4F, SGS0A can be selected while SGS0B, SGS0C, and SGS0D are unselected. At the same time, SGS1A can be selected while SGS1B, SGS1C, and SGS1D are unselected. Thus, a row decoder 124 could have additional switch transistors 710 to provide other select gate voltages VSGS to other select gate lines in a block.

In some embodiments, when a block is not selected, BLKSELn 722 is used to turn on switch transistors 712 and 714 to provide Vss to SGD and SGS. Transistors 712 and 714 may be referred to as grounding transistors. One terminal of grounding transistors 712 and 714 may be provided with a low voltage (labelled as Vss, which could be ground). The grounding transistors 712 and 714 may be used to ground transistors 702 and 710 when a block is not selected. In this embodiment, there is a grounding transistor 712 connected to the transistor 702 for SGD. In this embodiment, there is also a grounding transistor 714 connected to the transistor 710 for SGS. In some embodiments, there is not a grounding transistor 714 connected to the transistor 710 for SGS.

The various transistors 702-714 are used to implement switches to provide voltages to the conductive lines in the block. Together, transistors 702 and 704 form at least part of a drain select gate switch. Together, transistors 710 and 714 form at least part of a source select gate switch. In this example, a single transistor is depicted for the switches for the dummy and data memory cell CGs. However, more than one transistor, as well as other circuit elements could be included in the switches.

Note that a switch that provides voltages to a data word line could alternatively be referred to as a data word line switch, a data memory cell control gate switch, or more simply as a data control gate switch. Likewise, a switch that provides a voltage to a dummy word line could alternatively be referred to as a dummy word line switch, a dummy memory cell control gate switch, or more simply as a dummy control gate switch. Also, a switch that provides voltages to a select line could alternatively be referred to as a select line switch or as a select gate control gate switch.

Note that in some cases, the switches in the row decoder 124 may operate such that the conductive lines are at a floating voltage. In some embodiments, a transistor in a row decoder is turned off to float a conductive line. In one embodiment, transistors 706(0) to 706(n) are turned off to float the data word lines WL0-WLn. In one embodiment, transistor 704 and/or 708 is turned off to float dummy word line DD and/or DS. The transistors may be turned off by applying a suitable voltage to the gate of the transistor via BLKSEL 720, in one embodiment.

Figure 7B:
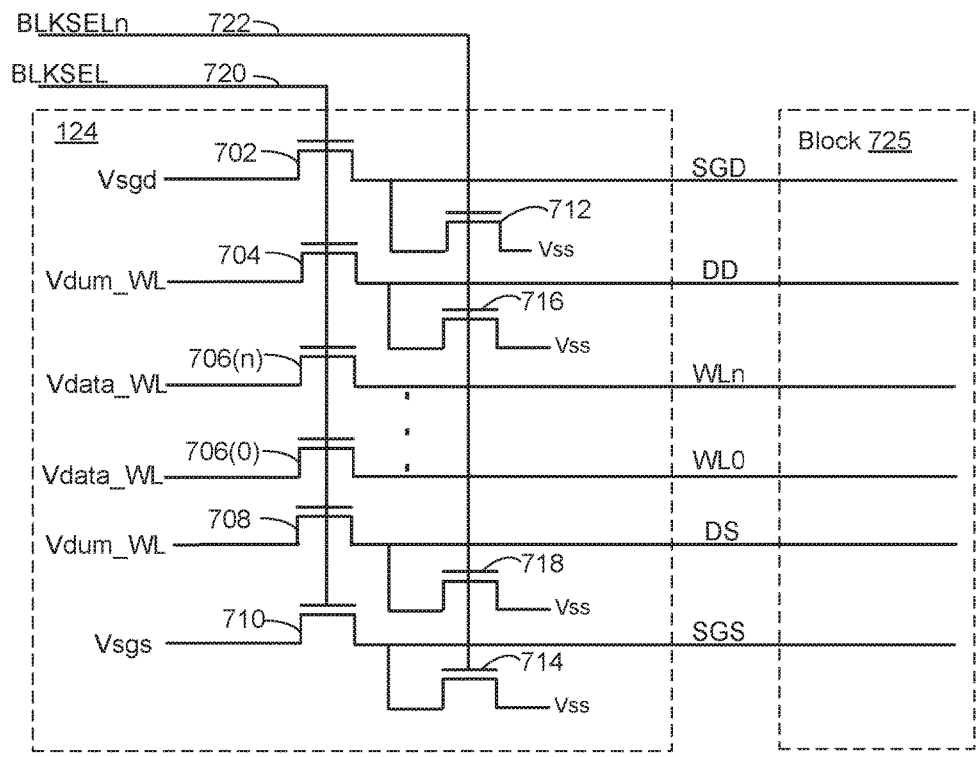
FIG. 7B is a simplified schematic diagram of one embodiment of a row decoder that provides voltages to a block of memory cells.

FIG. 7B is a simplified schematic diagram of one embodiment of a row decoder 124 that provides voltages to a block 725 of memory cells. For simplicity only row decoder and one block of memory cells are depicted in FIG. 7B. However, similar row decoders can be used for other blocks in the same plane, as in the example of FIG. 7A. The embodiment of FIG. 7B is similar to the one of FIG. 7B, but adds grounding transistors 716, 718 connected to transistors 704, 708, respectively. The embodiment of FIG. 7B permits the dummy word lines to be grounded while floating the data word lines. For example, BLKSEL 720 can be used to turn off all of transistors 702, 704, 706, 708, and 710. At the same time, BLKSELn 722 can be used to turn on transistors 712, 714, 716, and 718. Under such conditions, SGD, DD, DS, and SGS will have Vss applied thereto (a voltage other than Vss can be used). Also, the data word lines WL0-WLn will float. Note that the data word lines may float at their present voltages.

Figure 8:
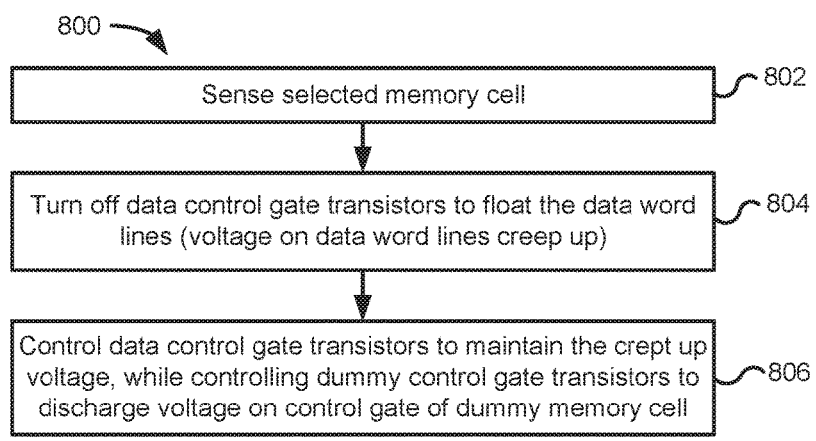
FIG. 8 is a flowchart of one embodiment of a process of operating non-volatile storage.

FIG. 8 is a flowchart of one embodiment of a process 800 of operating non-volatile storage. The process 800 may be used to eliminate, or at least reduce, creep up voltage on a dummy memory cell control gate. Process 800 could be used to eliminate, or at least reduce, creep up voltage on dummy memory cell at a drain end, a source end, or both drain and source ends of a string of memory cells. Process 800 could be used to eliminate, or at least reduce, creep up voltage on one or more dummy memory cells at the same end of the string. The string may be a NAND string. In one embodiment, the NAND string is in a 3D memory array, such as the examples provided herein. When there is more than one dummy memory cell at one end of the string, process 800 is used to eliminate, or at least reduce, creep up voltage on at least the dummy memory cell that is immediately adjacent to the select gate, in one embodiment. Process 800 may be performed by a control circuit, which may include but is not limited to: control circuitry 110, state machine 112, decoders 114/124/132, power control module 116, sense blocks 150, read/write circuits 128, and controller 122.

Figure 9:
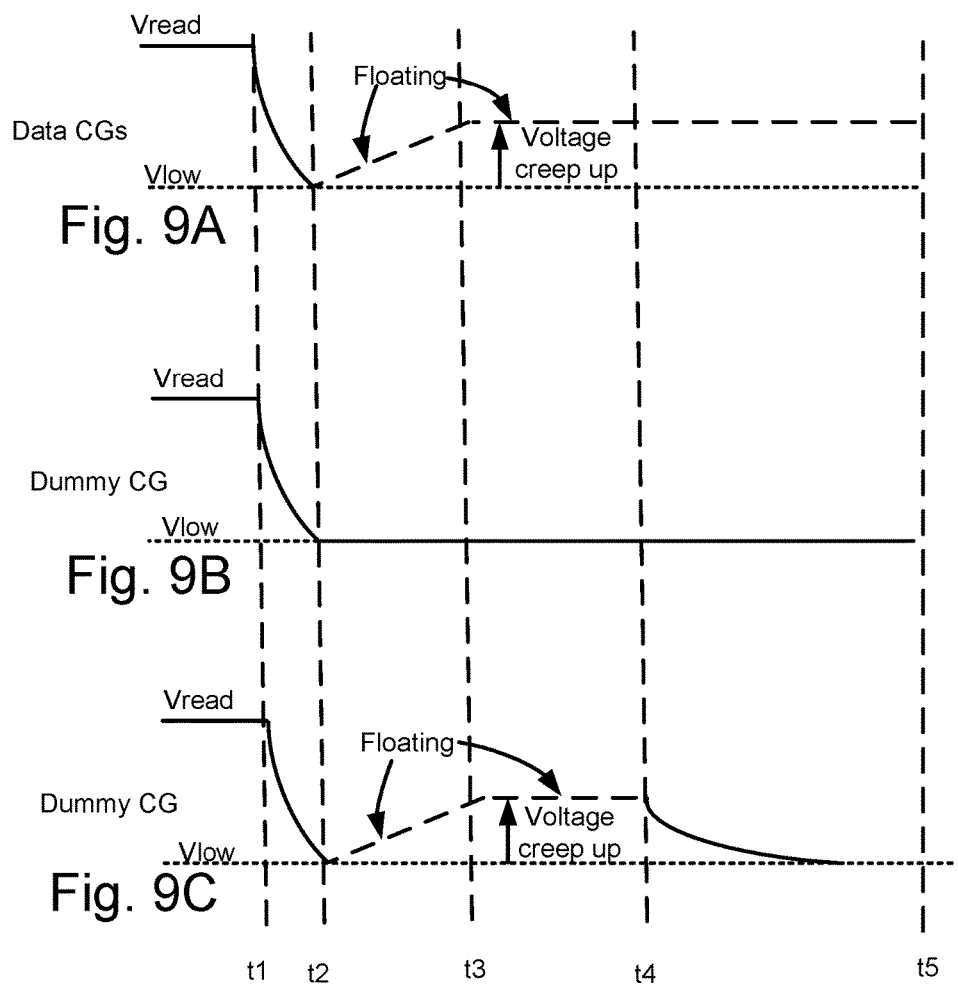
FIG. 9A depicts on example of voltages on data memory cell control gates after sensing a selected memory cell.
FIGS. 9B and 9C depict alternative examples of voltages on dummy memory cell control gates after sensing a selected memory cell.

FIG. 9A depict one example of voltages on data memory cell control gates during one embodiment of process 800. FIG. 9B depict one example of voltages on dummy memory cell control gates during one embodiment of process 800. FIG. 9C depict one example of voltages on dummy memory cell control gates during another embodiment of process 800. These waveforms will be referred to when discussing process 800. However, it will be understood that process 800 is not limited to these examples.

Step 802 includes sensing a selected memory cell. Further details of sensing a selected memory cell are provided in connection with FIGS. 10 and 11A-11I. Briefly, it will be noted that near the end of one embodiment of a sensing operation, both the data and dummy word lines (and hence data memory cell control gates and dummy memory cell control gates) are at a read pass voltage (e.g., Vread).

Step 804 includes providing conditions after sensing the selected memory cell that allow a voltage on data memory cell control gates to creep up. In one embodiment, these conditions include floating the data word lines. In one embodiment, the data word lines are floated by turning off transistors 706(0) to 706(n).

FIG. 9A depicts on example of voltages on data memory cell control gates after sensing a selected memory cell. Just prior to time t1, the voltage on the data memory cell control gates is at Vread. FIGS. 9B and 9C depict alternative examples of voltages on dummy memory cell control gates after sensing a selected memory cell. Just prior to time t1, the voltage on the data memory cell control gates is also at Vread.

In one embodiment, a control circuit applies Vread to drains of transistors 706(0) to 706(n) and applies a BLKSEL 720 signal to the gates of transistors 706(0) to 706(n) to turn those transistors on to pass Vread to the data memory cell control gates. In one embodiment, the control circuit also applies Vread to drains of transistors 704 and 708 while the BLKSEL 720 signal is applied the gates of transistors 704 and 708 to turn those transistors on to pass Vread to the dummy memory cell control gates.

FIGS. 9A-9C depict the voltages on the word lines dropping from Vread to some lower voltage between time t1 and t2. In one embodiment of step 804, the control circuit reduces Vread on the drains of transistors 704, 706, 708 to a lower voltage at time t1. It may take some time for the voltage on the word lines to drop, as depicted between time t1 and t2 in FIGS. 9A-9C. The lower voltage is labeled as "Vlow" in FIGS. 9A-9C. Note that the lower voltage need not be the same for all word lines.

FIG. 9A shows the voltage on the data memory cell control gates creeping up between time t2 and t3. In one embodiment, the control circuit floats the data word lines (and hence data memory cell control gates) to provide conditions that allow the voltage to creep up. In one embodiment, the control circuit turns off transistors 706(0)-706(n) at time t2, which floats the data word lines. Note that the voltage may be maintained on the data memory cell CGs for a substantial time, such as tens of minutes.

FIG. 9B shows the voltage on does not creep up on the dummy memory cell control gates at all. In one embodiment, the control circuit does not float the dummy word lines at time t2. In one embodiment, the control circuit keeps transistors 704 and 708 on at least between times t1 and t4.

FIG. 9C shows the voltage on the dummy memory cell control gates creeping up between time t2 and t3. In one embodiment, the control circuit floats the dummy word lines (and hence dummy memory cell control gates). In one embodiment, the control circuit turns off transistors 704 and 708 at time t2, which floats the dummy word lines. However, note that the crept up voltage is discharged at time t4. Also, note that the amount of time that the data memory cell CGs maintain the crept up voltage can vastly exceed the very brief time that the dummy memory cell CG are at or near the creep up voltage. For example, the voltage might only creep up on the dummy memory cell CGs for a few milliseconds. Hence, there is very little time for development of negative effects, such as a drop is select gate threshold voltage.

Step 806 includes controlling a dummy memory cell CG switch and the plurality of data memory cell CG switches to maintain the crept up voltage on the data memory cell control gates and at the same time discharge a voltage on the dummy memory cell control gate. Step 806 may involve a dummy control gate switch at a drain end of the memory cell string, a source end of the memory cell string or both the drain and source end of the memory cell string. In some cases there may be more than one dummy control gate switch at each end of the string. In one embodiment, step 806 involves at least the dummy control gate switch that is immediately adjacent to the select gate.

With reference to FIG. 9A, the crept up voltage on the data memory cell control gates is maintained at least between time t3 and t5. In one embodiment, the control circuit continues to float the data memory cell control gates in order to maintain the crept up voltage. In one embodiment, the control circuit continues to keep transistors 706 off to maintain the crept up voltage.

With reference to FIG. 9B, the voltage on the dummy memory cell control gates stays at Vlow between time t2 and t5. Note that were it not for the actions of the control circuit controlling the dummy control gate switch, the voltage would creep up on the dummy control gate switch. Hence, the actions control circuit serve to discharge a voltage on the dummy memory cell control gates. In one embodiment, the control circuit keeps transistor 704 and 708 on to allow a path through the transistor 704 and 708 to discharge a voltage on the dummy memory cell control gates.

With reference to FIG. 9C, the voltage on the dummy memory cell control gates is reduced staring at time t4. In one embodiment, the control circuit turns transistor 704 and 708 on to discharge the crept up voltage on the dummy memory cell control gates. Hence, the actions control circuit serve to discharge a voltage on the dummy memory cell control gates.

Figure 10:
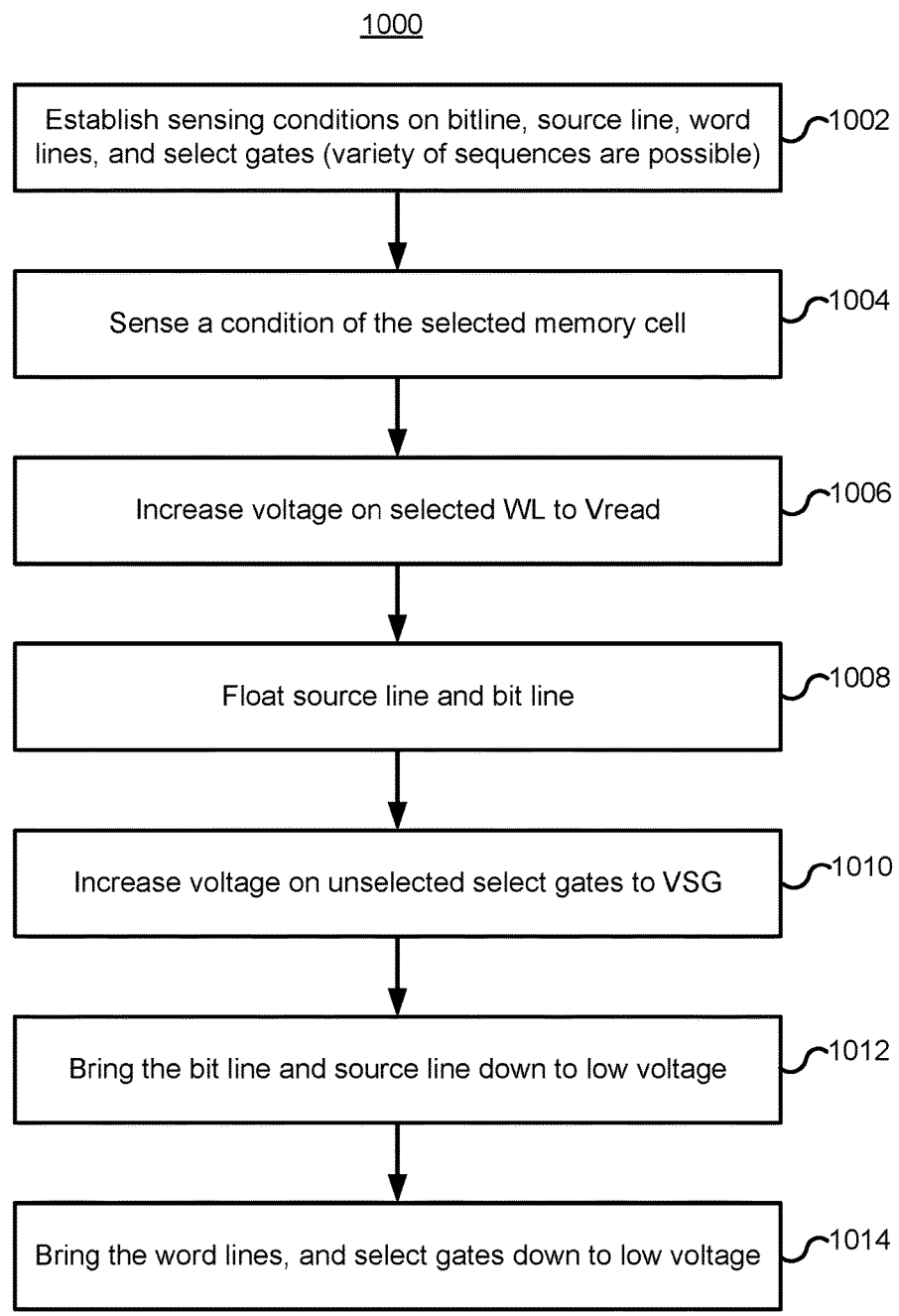
FIG. 10 is flowchart of one embodiment of a process of sensing a non-volatile memory cell.

FIG. 10 is flowchart of one embodiment of a process 1000 of sensing a non-volatile memory cell. The process 1000 is one embodiment of step 802. FIGS. 11A-11I are timing diagrams of voltages on various conductive lines in one embodiment of process 1000. The timing diagrams show one possible sequence of voltages on various conductive lines. However, other sequences are possible. The timing diagrams show possible magnitudes of voltages on various conductive lines. However, other magnitudes are possible. Note that times t1-t5 in FIGS. 11A-11I do not correspond to times t1-t5 in FIGS. 9A-9C. Process 1000 may be performed by a control circuit, which may include but is not limited to: control circuitry 110, state machine 112, decoders 114/124/132, power control module 116, sense blocks 150, read/write circuits 128, and controller 122.

Step 1002 includes establishing sensing conditions. Step 1002 may include establishing voltages on a selected bit line, a source line, word lines, and select gate lines. The word lines provide the voltage to memory cell control gates, and the select gate lines provide the voltage to the control gate of select gate transistors. FIGS. 11A-11I depict sensing conditions prior to time t1. FIG. 11A shows the bit line at a selected bit line voltage Vbl. FIG. 11B shows the drain select line (SGD_SEL) at voltage Vsgd. FIG. 11C shows a dummy word line (DWL) at a read pass voltage (Vread). FIG. 11D shows a selected data word line (Sel_WL) at a read reference voltage (Vcgr). The read reference voltage could be one of Vv1-Vv7 or Vr1-Vr7 in FIG. 5, for example. FIG. 11E shows an unselected data word line (Unsel_WL) at a read pass voltage (Vread). FIG. 11F shows the source select line (SGS_SEL) at voltage Vsgs. FIG. 11G shows the source line (Source) at voltage Vsrc. FIG. 11H shows an unselected drain select line (SGD_USEL) at voltage Vss. FIG. 11I shows an unselected source select line (SGS_USEL) at voltage Vss.

Step 1004 includes sensing the selected memory cell. Step 1104 may include circuitry in a sense block 150 sensing a condition of the selected memory cell, such as a current that flows in the bit line.

Step 1006 includes increasing the voltage on the selected word line to the read pass voltage. FIG. 11D depicts the voltage on the selected word line increasing from Vcgr to Vread between time t1 and t2.

Step 1008 includes floating the source line and the selected bit line. FIG. 11A depicts the voltage on the bit line floating between time t1 and t3. FIG. 11G depicts the voltage on the source line floating between time t1 and t3. In each case, the voltage drops as it floats. Note that the dashed line indicates that the conductive line is floating.

Step 1010 includes increasing the voltage on the unselected select gates to VSG. FIG. 11H depicts the voltage on SGD_USEL increasing from Vss at time t1 to Vsg by about time t2. FIG. 11I depicts the voltage on SGS_USEL increasing from Vss at time t1 to Vsg by about time t2.

Step 1012 includes bringing the bit line and the source line down to a low voltage. FIG. 11A shows the voltage on the bit line being brought down between time t3 and t4. Note that the bit line and the source line are no longer floating after time t3. In this example, the bit line and the source line are brought down to Vss (which may be ground), but they could be brought down to a different voltage.

Step 1014 includes bringing the word lines and select gates down to a low voltage. FIG. 11B shows the voltage on SGD_SEL being brought down to Vss between time t4 and t5. FIG. 11C shows the voltage on DWL being brought down to Vss between time t4 and t5. FIG. 11F shows the voltage on SGS_SEL being brought down to Vss between time t4 and t5. FIG. 11H shows the voltage on SGD_USEL being brought down to Vss between time t4 and t5. FIG. 11I shows the voltage on SGS_USEL being brought down to Vss between time t4 and t5. Note that brining the word lines down beginning at time t4 may correspond to time t1 in FIGS. 9A to 9C, in some embodiments.

FIG. 11D shows the voltage on Sel_WL being brought down to Vdd between time t4 and t5. FIG. 11E shows the voltage on Unsel_WL being brought down to Vdd between time t4 and t5 down to Vdd.

In this example, voltages on SGD_SEL, DWL, SGS_SEL, SGD_USEL, and SGS_USEL are each brought down to Vss. An example of Vss is ground. In this example, voltages on Sel_WL and Unsel_WL are each brought down to Vdd. An example of Vdd is 1.8V. However, each of these conductive lines could be brought down to another low voltage.

Figure 12A:
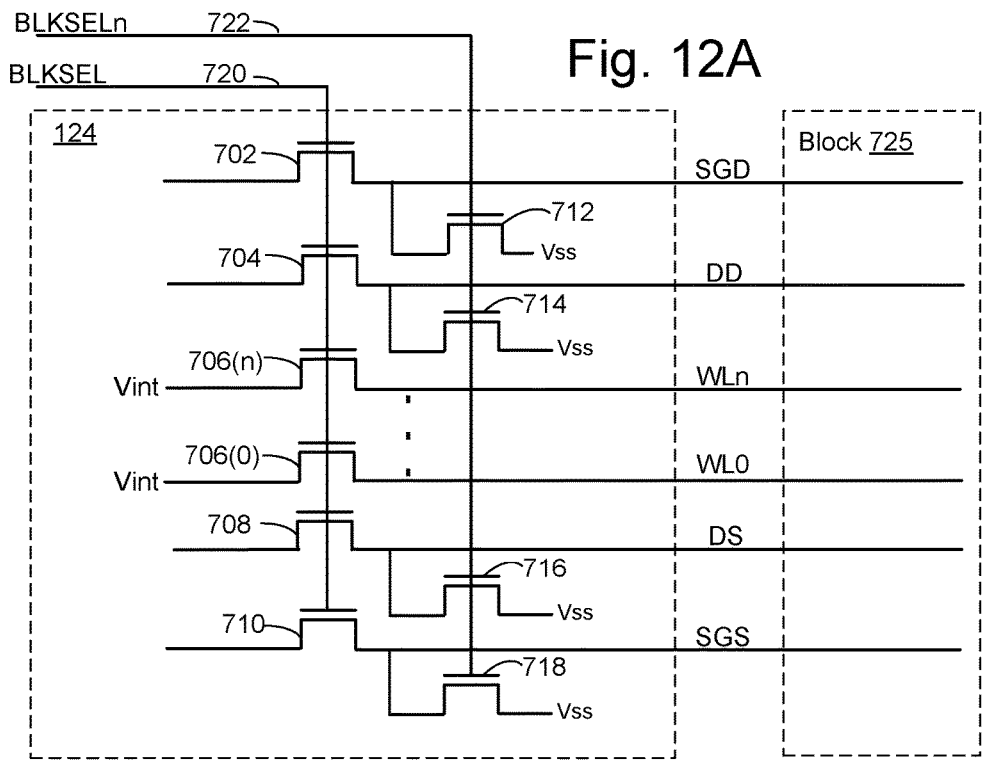
FIG. 12A is a schematic diagram of one embodiment of a row decoder that provides signals to a block of memory cells.

FIG. 12A is a schematic diagram of one embodiment of a row decoder 124 that provides signals to a block 725 of memory cells. The diagram shows one embodiment of signals provided to the row decoder 124. These conditions may be used during one embodiment of step 806 of process 800. The conditions in FIG. 12A are for when the block is not presently selected. Thus, BLKSEL 720 provides a signal to the gates of transistors 702, 704, 706, 708, and 710 to turn off those transistors. BLKSELn 722 provides a signal to transistors 712, 714, 716, and 718 to turn those transistors on. Note the Vss is applied to one terminal of transistors 712, 714, 716, and 718, which results is Vss being applied to the select lines and the dummy word lines.

The block was previously sensed, such that a crept up voltage developed on the data word lines. An intermediate voltage (Vint) is applied to the drains of the data switch transistors 706. This voltage is between ground and the magnitude of the crept up word line voltage, in one embodiment. The intermediate voltage on the drains of the data switch transistors 706 reduces the difference between the source and drain potential, in some embodiments.

Figure 12B:
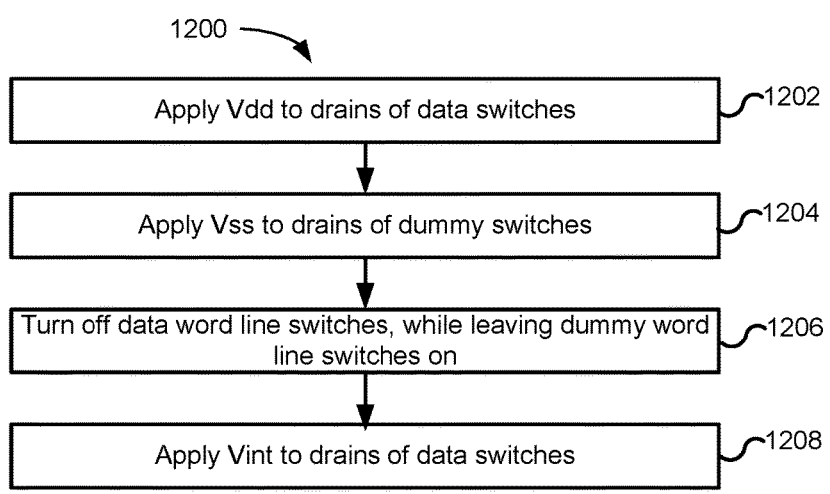
FIG. 12B is a flowchart of one embodiment of a process of applying signals to a row decoder.

The signals in FIG. 12A may be applied immediately after the block was selected for a sense operation. FIG. 12B is a flowchart of one embodiment of a process 1200 of applying signals to a row decoder 124. The process 1200 begins at the end of the sensing phase, in one embodiment. In one embodiment, the process 1200 begins with the conditions at time t5 in FIGS. 11A-11I. In one embodiment, the process 1200 begins with the block selected such that BLKSEL 720 applies a signal to the control gates of transistors 702-710 to turn on those transistors. Process 1200 may be performed by a control circuit, which may include but is not limited to: control circuitry 110, state machine 112, decoders 114/124/132, power control module 116, sense blocks 150, read/write circuits 128, and controller 122.

Step 1202 includes applying Vdd to an input of data control gate switches. In one embodiment, Vdd is applied to the drains of data switch transistors 706. At this time, transistors 706 are on such that Vdd is passed to the data control gates. In one embodiment, Vdd is about 1.5V. Note that a higher or lower magnitude than Vdd could be used.

Step 1204 includes applying Vss to an input of a dummy control gate switch. This could be at the drain and/or source end of the string of memory cells. In one embodiment, Vss is applied to the drains of switch transistors 704, 708. At this time, transistors 704 and 710 are on such that Vdd is passed to the data control gates. Step 1204 may also include applying Vss to drains of select gate switches. In one embodiment, Vss is applied to the drains of dummy switch transistors 704, 708. At this time, transistors 704 and 708 are on such that Vdd is passed to the data control gates. Note that at this time transistors 712, 714, 716, and 718 may be off.

Step 1206 includes turning off the data word line switches while leaving on the dummy control gate switches. Also, the select gate switches may remain on. In one embodiment, step 1206 includes changing both BLKSEL 720 and BLKSELn 722, such that transistors 702-710 are turned off, and transistors 712, 714, 716, and 718 are turned on. Note that Vss may be applied to one terminal of transistors 712, 714, 716, and 718 such the Vss continues to be applied to the dummy memory cell CGs and the CGs of select gates.

Note that the voltage will typically not creep up on the data memory cell control gates until after the data memory cell CG switches are turned off in step 1206. Thus, by keeping the dummy memory cell CG switches on with Vss applied to an input of the switches, it may be possible to prevent any voltage creep on the dummy memory cell CGs, or at least discharge such voltage quickly as it is developing. In one embodiment, the voltage on the data memory cell CGs resembles FIG. 9A, and the voltage on the dummy memory cell CGs resembles FIG. 9B, after step 1206. However, there could be some creep up on the dummy memory cell CGs, as depicted in FIG. 9C.

Step 1208 includes applying Vint to the data control gate switches. In one embodiment, Vint is applied to the drains of data switch transistors 706. In one embodiment, Vint is sufficiently high to prevent the crept up voltage from discharging through transistors 706.

Figure 12C:
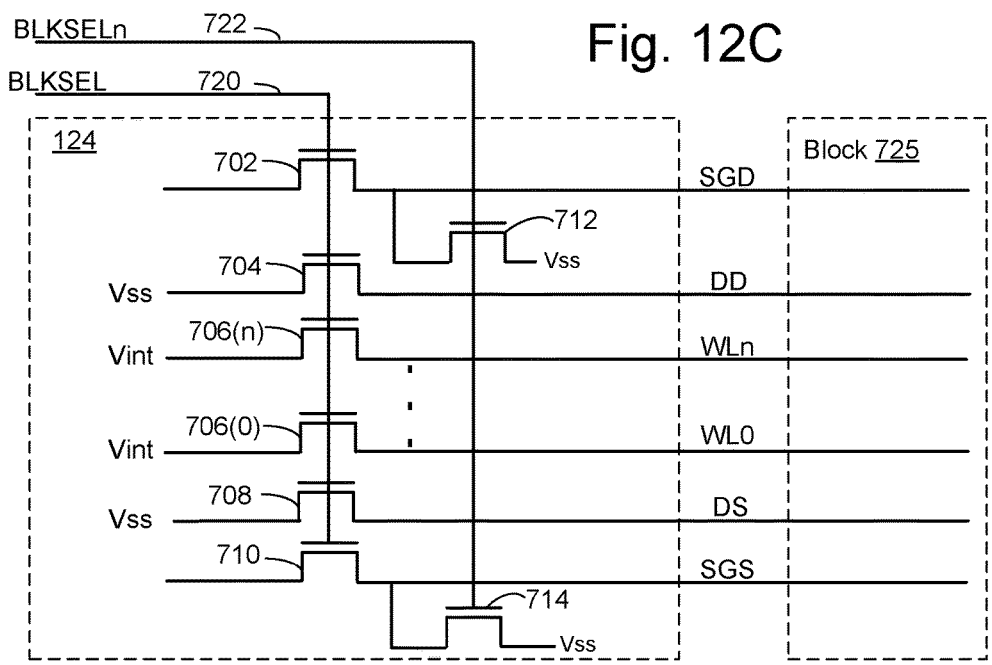
FIG. 12C is a schematic diagram of one embodiment of a row decoder that provides signals to a block of memory cells.

FIG. 12C is a schematic diagram of one embodiment of a row decoder 124 that provides signals to a block 725 of memory cells. The diagram shows one embodiment of signals provided to the row decoder 124. These conditions may be used during one embodiment of step 806. The conditions in FIG. 12V are for when the block is not presently selected. Thus, BLKSEL 720 provides a signal to the gates of transistors 702, 704, 706, 708, and 710 to turn off those transistors. BLKSELn 722 provides a signal to transistors 712 and 714 to turn those transistors on. Note the Vss is applied to one terminal of transistors 712 and 714, which results is Vss being applied to the select lines.

The block was previously sensed, such that a crept up voltage developed on the data word lines. An intermediate voltage (Vint) is applied to the drains of the data switch transistors 706. This voltage is between ground and the magnitude of the crept up word line voltage, in one embodiment. The intermediate voltage on the drains of the data switch transistors 706 reduces the difference between the source and drain potential, in some embodiments. A voltage Vss is applied to the drains of the dummy switch transistors 704 and 708.

Figure 12D:
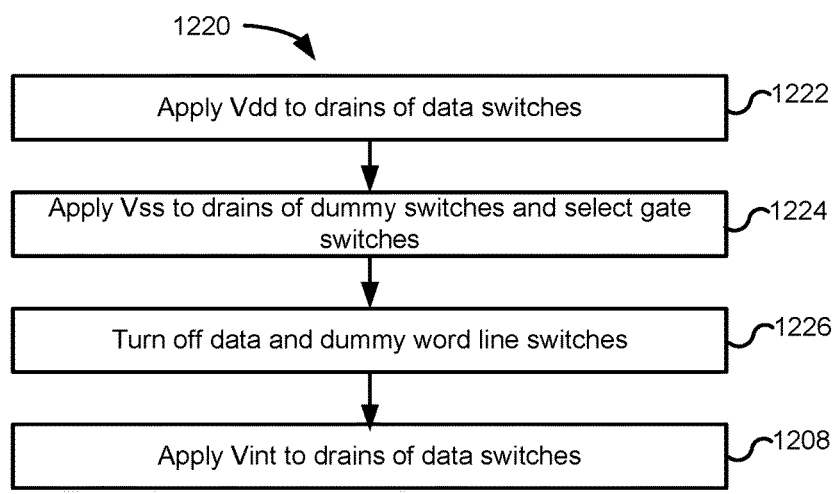
FIG. 12D is a flowchart of one embodiment of a process of applying signals to a row decoder.

The signals in FIG. 12C may be applied immediately after the block was selected for a sense operation. FIG. 12D is a flowchart of one embodiment of a process 1220 of applying signals to a row decoder 124. The process 1220 begins at the end of the sensing phase, in one embodiment. In one embodiment, the process 1220 begins with the conditions at time t5 in FIGS. 11A-11I. In one embodiment, the process 1220 begins with the block selected such that BLKSEL 720 applies a signal to the control gates of transistors 702-710 to turn on those transistors. Process 1220 may be performed by a control circuit, which may include but is not limited to: control circuitry 110, state machine 112, decoders 114/124/132, power control module 116, sense blocks 150, read/write circuits 128, and controller 122.

Step 1222 includes applying Vdd to an input of data control gate switches. In one embodiment, Vdd is applied to the drains of data switch transistors 706. At this time, transistors 706 are on such that Vdd is passed to the data memory cell control gates. In one embodiment, Vdd is about 1.5V. Note that a higher or lower magnitude than Vdd could be used.

Step 1224 includes applying Vss to an input of a dummy control gate switch. This could be at the drain and/or source end of the string of memory cells. In one embodiment, Vss is applied to the drains of dummy switch transistor 704, 708. At this time, transistors 704 and 708 are on such that Vdd is passed to the data memory cell CGs. Step 1224 may also include applying Vss to drains of select gate switches. In one embodiment, Vss is applied to the drains of \dummy switch transistor 704, 708. At this time, transistors 704 and 708 are on such that Vdd is passed to the data control gates. Note that at this time transistors 712 and 714 may be off.

Step 1226 includes turning off the data memory cell CG switches and the dummy memory cell CG switches. Also, the select gate switches may remain on. In one embodiment, step 1226 includes changing both BLKSEL 720 and BLKSELn 722, such that transistors 702-710 are turned off, and transistors 712 and 714 are turned on. Note that Vss may be applied to one terminal of transistors 712 and 714 such the Vss continues to be applied to the CGs of select gates.

Note that the voltage will typically not creep up on the data memory cell control gates until after the data memory cell CG switches are turned off in step 1226. It is possible that the voltage may creep up on the dummy memory cell CGs, as well. However, by applying Vss to the drains of the dummy switch transistors 704 and 708, any voltage creep on the dummy memory cell CGs may be discharged through transistors 704 and 708. In one embodiment, the voltage on the data memory cell CGs resembles FIG. 9A, and the voltage on the dummy memory cell CGs resembles FIG. 9B, after step 1206. However, there could be some creep up on the dummy memory cell CGs, as depicted in FIG. 9C.

Step 1208 includes applying Vint to an input of the data control gate switches. In one embodiment, Vint is applied to the drains of data switch transistors 706. In one embodiment, Vint is sufficiently high to prevent the crept up voltage from discharging through transistors 706.

Figure 12E:
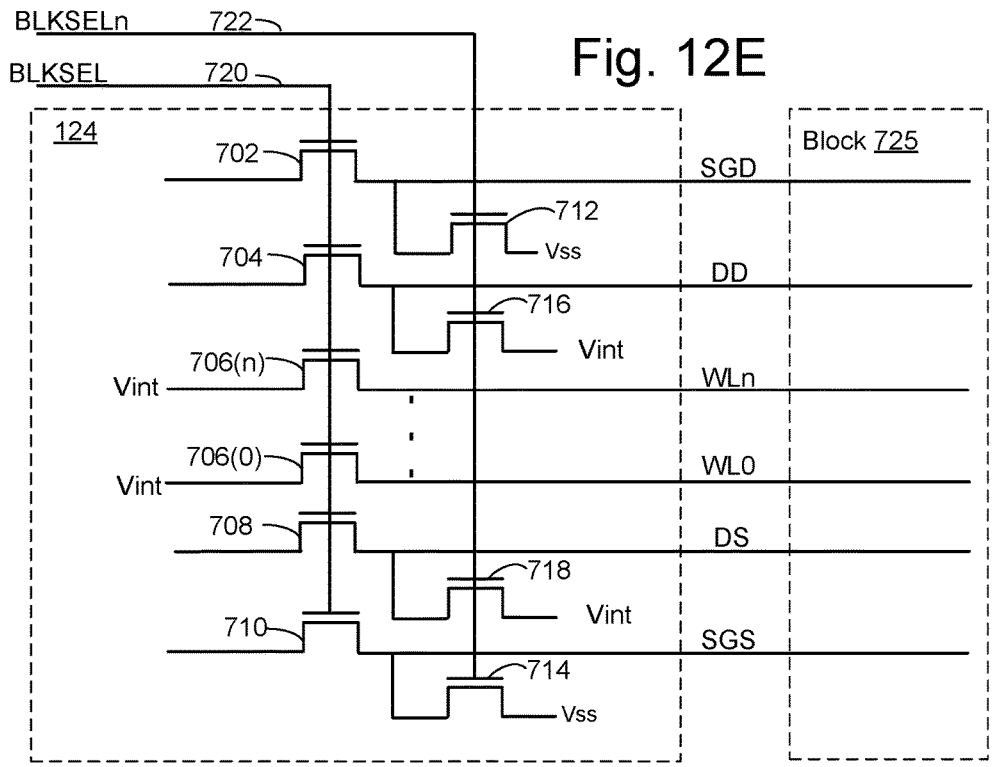
FIG. 12E is a schematic diagram of one embodiment of a row decoder that provides signals to a block of memory cells.

FIG. 12E is a schematic diagram of one embodiment of a row decoder 124 that provides signals to a block 725 of memory cells. The diagram shows one embodiment of signals provided to the row decoder 124. These conditions may be used during one embodiment of step 806. The conditions in FIG. 12E are for when the block is not presently selected. Thus, BLKSEL 720 provides a signal to the gates of transistors 702, 704, 706, 708, and 710 to turn off those transistors. BLKSELn 722 provides a signal to transistors 712, 714, 716, and 718 to turn those transistors on. Note that Vss is applied to one terminal of transistors 712 and 714, which results is Vss being applied to the select lines. Note that Vint is applied to one terminal of transistors 716 and 718, which results is Vint being applied to the dummy word lines.

The block was previously sensed, such that a crept up voltage developed on the data word lines. An intermediate voltage (Vint) is applied to the drains of the data switch transistors 706. This voltage is between ground and the magnitude of the crept up word line voltage, in one embodiment. The intermediate voltage on the drains of the data switch transistors 706 reduces the difference between the source and drain potential, in some embodiments.

Figure 12F:
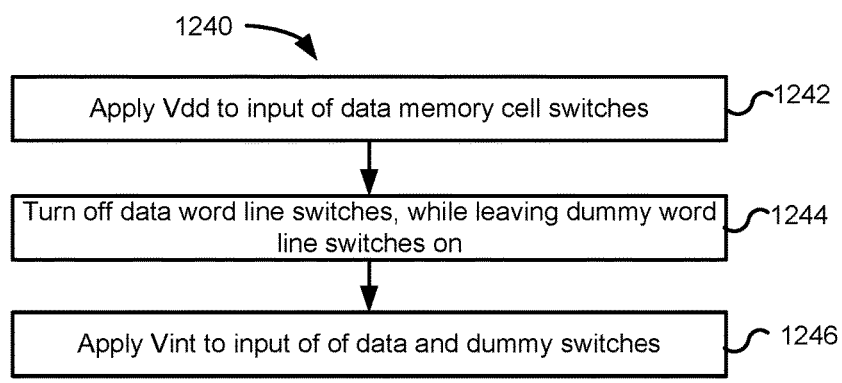
FIG. 12F is a flowchart of one embodiment of a process of applying signals to a row decoder.

The signals in FIG. 12E may be applied immediately after the block was selected for a sense operation. FIG. 12F is a flowchart of one embodiment of a process 1240 of applying signals to a row decoder 124. The process 1240 begins at the end of the sensing phase, in one embodiment. In one embodiment, the process 1240 begins with the conditions at time t5 in FIGS. 11A-11I. In one embodiment, the process 1240 begins with the block selected such that BLKSEL 720 applies a signal to the control gates of transistors 702-710 to turn on those transistors. Process 1240 may be performed by a control circuit, which may include but is not limited to: control circuitry 110, state machine 112, decoders 114/124/132, power control module 116, sense blocks 150, read/write circuits 128, and controller 122.

Step 1242 includes applying Vdd to an input of data control gate switches. In one embodiment, Vdd is applied to the drains of data switch transistors 706. At this time, transistors 706 are on such that Vdd is passed to the data memory cell control gates. In one embodiment, Vdd is about 1.5V. Note that a higher or lower magnitude than Vdd could be used.

Step 1244 includes turning off the data word line switches while leaving on the dummy control gate switches. Also, the select gate switches may remain on. In one embodiment, step 1244 includes changing both BLKSEL 720 and BLKSELn 722, such that transistors 702-710 are turned off, and transistors 712, 714, 716, and 718 are turned on. Note that Vint may be applied to one terminal of transistors 716 and 718 such the Vint is now applied to the dummy memory cell CGs. Also, Vss may be applied to one terminal of transistors 712 and 714 such the Vss is now applied to the select lines.

Note that the voltage will typically not creep up on the data memory cell control gates until after the data memory cell CG switches are turned off in step 1206. Thus, by keeping the dummy memory cell CG switches on with Vint applied to an input of the switches, it may be possible to prevent any voltage creep on the dummy memory cell CGs, or at least discharge such voltage quickly as it is developing. In one embodiment, the voltage on the data memory cell CGs resembles FIG. 9A, and the voltage on the dummy memory cell CGs resembles FIG. 9B, after step 1244. However, there could be some creep up on the dummy memory cell CGs, as depicted in FIG. 9C. However, step 1244 will discharge any such creep up on the dummy memory cell CGs.

Step 1246 includes applying Vint to an input of the data control gate switches. In one embodiment, Vint is applied to the drains of data switch transistors 706. In one embodiment, Vint is sufficiently high to prevent the crept up voltage from discharging through transistors 706.

In some embodiments, a block select line is shared between multiple block. Thus, the block select line may connect to control gates of switch transistors in row decoders 124 for different blocks. However, by providing appropriate voltages to inputs of the switch transistors, only one of the blocks is selected.

FIG. 13 is a block diagram of one embodiment in which a block select line is shared among a group of four blocks. There is one selected block 1302, three special unselected blocks 1304a, 1304b, and 1304c, and several unselected blocks 1306. All of the blocks are in the same plane, in one embodiment. Typically, there will be many more unselected blocks 1306.

Row decoder 124a is used to provide signals to special unselected block 1304a. Row decoder 124b is used to provide signals to special unselected block 1304b. Row decoder 124c is used to provide signals to special unselected block 1304c. Row decoder 124d is used to provide signals to selected block 1302. The same BKLSEL 720 line is input to each of the four decoders 124a-124d. The same BKLSELn 722 line is input to each of the four decoders 124a-124d. The row decoders 124 could be implemented such as in the examples of FIG. 7A or 7B, but are not limited to those examples. Note that row decoders and block select lines for the other unselected blocks 1306 are not depicted, so as to not obscure the diagram.

Herein, the blocks that share a common select line are referred to as a "shared select line group." There could be more a fewer than four blocks in a shared select line group.

In one embodiment, two sets of signals are used to drive the inputs of the switch transistors in the row decoders 124a-124d for a shared select line group. These signals can be divided into a ready phase and a busy phase. In the busy phase, one of the blocks in the shared select line group is selected for a memory array operation. In the ready phase, none of the blocks in the shared select line group is selected for a memory array operation. In one embodiment, the same signals are provided to a row decoder for the selected block 1302 and the special unselected blocks 1304a-c in the shared select line group. However, different signals may be provided to the special unselected blocks 1304a-c than are provided to the selected block 1302 during the busy phase. These different signals to the special unselected blocks 1304a-c help them to operate as an unselected block, even though the BLKSEL 720 may turn on switch transistors that are normally used to provide signals to conductive lines during a memory array operation. For example, during a program operation in selected block 1302, a program voltage may be provided to one of the data switch transistors 706, to provide a program voltage to the selected word line. However, the programming voltage is not provided to any of the data switch transistors 706 in the row decoders for the special unselected blocks 1304a-c, such that program disturb does not occur in those unselected blocks.

Figure 14A:
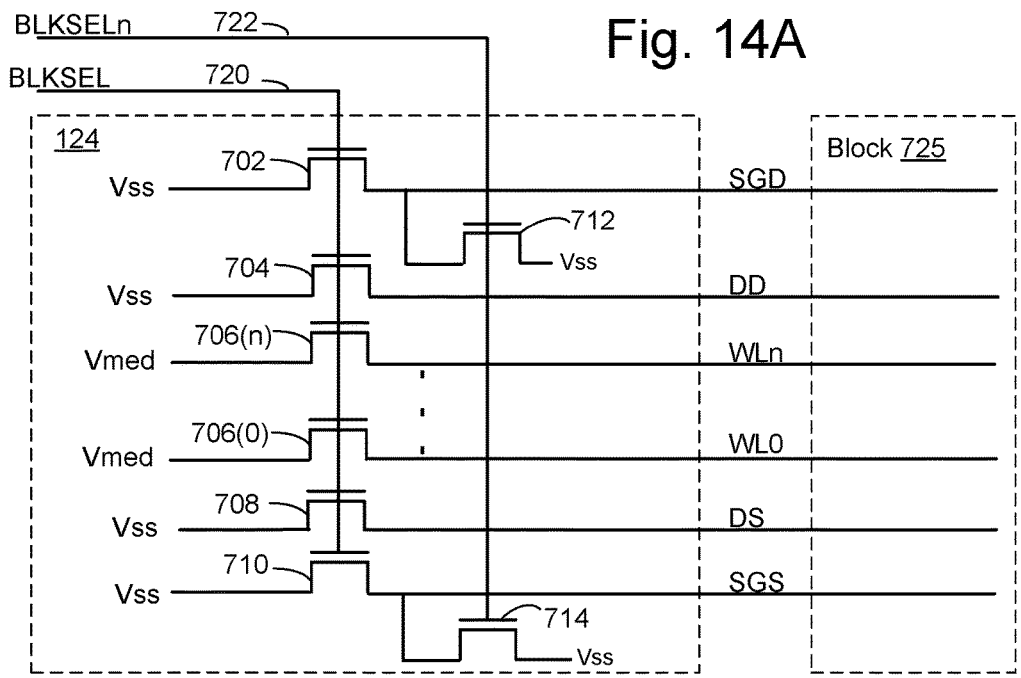
FIG. 14A is a schematic diagram of one embodiment of a row decoder that provides signals to a block of memory cells.

FIG. 14A is a schematic diagram of one embodiment of a row decoder 124 that provides signals to a block 725 of memory cells. The diagram shows one embodiment of signals provided to the row decoder 124. These conditions may be used during one embodiment of step 806. The conditions in FIG. 14A are for one embodiment of a special unselected block. Therefore, this may be used in one embodiment of the architecture of FIG. 13. BLKSEL 720 provides a signal to the gates of transistors 702, 704, 706, 708, and 710 to turn on those transistors. BLKSELn 722 provides a signal to transistors 712 and 714 to turn those transistors off.

The block was previously sensed, such that a crept up voltage developed on the data word lines. A medium voltage (Vmed) is applied to the drains of the data switch transistors 706. This voltage may be about the magnitude of the crept up word line voltage, in one embodiment. A voltage Vss is applied to the drains of the dummy memory cell switch transistors 704 and 708. Likewise, a voltage Vss is applied to the drains of the select line switch transistors 702 and 710.

The signals in FIG. 14A may be applied some time after the block was selected for a sense operation. For example, referring to FIG. 13, special unselected block 1304a may have been the selected block for a sensing operation (prior to when a memory array operation is performed in selected block 1302). The signals in FIG. 14A could be applied to the row decoder for special unselected block 1304a while a memory array operation is being performed in selected block 1302.

Figure 14B:
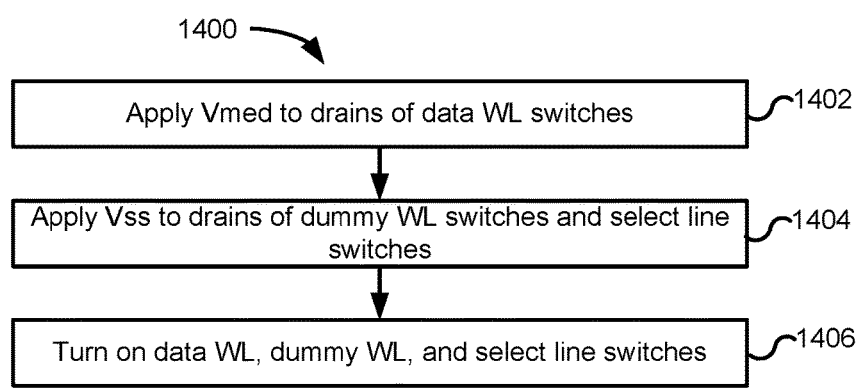
FIG. 14B is a flowchart of one embodiment of a process of applying signals to a row decoder.

FIG. 14B is a flowchart of one embodiment of a process 1400 of applying signals to a row decoder 124. The process 1400 begins following a ready phase, in one embodiment. In one embodiment, just prior to process 1400, transistors 702-710 are off, and transistors 712 and 714 are on. The select lines may be as Vss. Process 1400 may be performed by a control circuit, which may include but is not limited to: control circuitry 110, state machine 112, decoders 114/124/132, power control module 116, sense blocks 150, read/write circuits 128, and controller 122.

Step 1402 includes applying Vmed to an input of data control gate switches. In one embodiment, Vmed is applied to the drains of data switch transistors 706.

Step 1404 includes applying Vss to an input of a dummy control gate switch. This could be at the drain and/or source end of the string of memory cells. In one embodiment, Vss is applied to the drains of dummy switch transistors 704, 708.

Step 1406 includes turning on data WL switches and a dummy WL switch. In one embodiment, switch transistors 706 are turned on to pass Vmed to the data WLs. In one embodiment, switch transistors 704 and 708 are turned on to pass Vs to the dummy WLs.

Note that the voltage is typically already crept up on the data memory cell control gates prior to process 1400. The voltage may also crept up on the dummy memory cell control gates prior to process 1400 However, when dummy switch transistors 704 and/or 708 are turned on with Vss applied to their drains, any crept up voltage should quickly discharge.

However, the voltage may be maintained on the data word lines. Vmed is high enough to such that the crept up voltage will be maintained on the data word lines, in some embodiments. As noted Vmed may be about the same magnitude as the crept up voltage. In one embodiment, the voltage on the data memory cell CGs resembles FIG. 9A, and the voltage on the dummy memory cell CGs resembles FIG. 9C, after step 1406.

A first embodiment disclosed herein includes an apparatus, comprising: a string of non-volatile memory cells having data memory cells, a dummy memory cell, and a select gate. The dummy memory cell is between the data memory cells and the select gate. The apparatus also includes a dummy control gate switch configured to transfer a voltage to a control gate of the dummy memory cell, and a plurality of data control gate switches configured to transfer voltages to control gates of the data memory cells. The apparatus further includes a control circuit in communication with the string of non-volatile memory cells, the dummy control gate switch, and the plurality of data control gate switches. The control circuit is configured to sense a selected memory cell on the string; provide conditions that allow a voltage on the data memory cell control gates to creep up after the selected memory cell is sensed; and control the dummy control gate switch and the plurality of data control gate switches to maintain the crept up voltage on the data memory cell control gates and at the same time discharge a voltage on the dummy memory cell control gate.

In a second embodiment, and in accordance with the first embodiment, to maintain the crept up voltage on the data memory cell control gates and at the same time discharge a voltage on the dummy memory cell control gate, the control circuit is further configured to: turn the data control gate switches off to maintain the crept up voltage on the data memory cell control gates and keep the dummy control gate switch on to discharge a voltage on the dummy memory cell control gate.

In a third embodiment, and in accordance with the first embodiment, to maintain the crept up voltage on the data memory cell control gates and at the same time discharge a voltage on the dummy memory cell control gate, the control circuit is further configured to: apply a first voltage to an input of the dummy control gate switch and a second voltage to inputs of the data control gate switches, the first voltage is lower in magnitude than the second voltage.

In a fourth embodiment, and in accordance with the third embodiment, the control circuit is further configured to: turn the dummy control gate switch and the data control gate switches off while the first and second voltages are applied.

In a fifth embodiment, and in accordance with the fourth embodiment, the first voltage is ground.

In a sixth embodiment, and in accordance with the fourth or fifth embodiments, the second voltage is an intermediate voltage between ground and the crept up voltage.

In a seventh embodiment, and in accordance with the third embodiment, the control circuit is further configured to: turn the dummy control gate switch and the data control gate switches on while the first and second voltages are applied.

In eighth embodiment, and in accordance with the seventh embodiment, the first voltage is ground.

In a ninth embodiment, and in accordance with the seventh or eighth embodiments, the second voltage is approximately the crept up voltage. The second voltage may be sufficient to prevent the crept up voltage from discharging through the data control gate switches. The second voltage is within plus or minus 10 percent of the crept up voltage in one embodiment.

In a tenth embodiment, and in accordance with the seventh through ninth embodiments, the string of non-volatile memory cells is a first string in a first block of memory cells, and the dummy control gate switch is a first dummy control gate switch. The apparatus further comprises: a second dummy control gate switch configured to transfer a voltage to a dummy memory cell of a second string in a second block in the memory array; and a block select line that is connected to both the first and second dummy control gate switches. The block select line is configured to provide a signal to turn both the first and second dummy control gate switches on and off together. The control circuit is further configured to perform a memory array operation in the second block while controlling the first dummy control gate switch and the plurality of data control gate switches to maintain the crept up voltage on the data memory cell control gates of the first string and at the same time discharge a voltage on the first dummy memory cell control gate.

In an eleventh embodiment, and in accordance with the first through tenth embodiments, the string of non-volatile memory cells is a NAND string in a three-dimensional memory array.

One embodiment disclosed herein includes method of operating non-volatile storage. The method comprises sensing a selected memory cell on NAND string of non-volatile memory cells having data memory cells, a dummy memory cell, and a select gate. The dummy memory cell is immediately adjacent to the select gate. The sensing includes providing a read pass voltage to a dummy control gate switch to pass the read pass voltage to a control gate of the dummy memory cell, providing a read reference voltage to a data control gate switch to pass the read reference voltage to a control gate of the selected memory cell, and providing a read pass voltage to data control gate switches to pass the read pass voltage to control gates of the unselected memory cells on the string. The method further comprises turning off the data control gate switches after the selected memory cell is sensed to allow a voltage on the data memory cell control gates to creep up. The method further comprises controlling the data control gate switches to maintain the crept up voltage on the data memory cell control gates while controlling the dummy control gate switch to discharge a voltage on a control gate of the dummy memory cell.

One embodiment disclosed herein includes a three-dimensional non-volatile memory system, comprising: a NAND string of non-volatile memory cells having data memory cells, a dummy memory cell, and a select gate. The dummy memory cell resides between the data memory cells and the select gate. The memory system also includes dummy memory cell control gate biasing means for transferring a voltage to a control gate of the dummy memory cell; data memory cell control gate biasing means for transferring voltages to control gates of the data memory cells; sensing means for sensing a selected memory cell on the string; first control means for controlling the data memory cell control gate biasing means to allow a voltage on the data memory cell control gates to creep up after the selected memory cell is sensed; and second control means for controlling the dummy memory cell control gate biasing means and the data memory cell control gate biasing means to maintain the crept up voltage on the data memory cell control gates and at the same time discharge a voltage on the dummy memory cell control gate.

In one embodiment, the dummy memory cell control gate biasing means includes one or more of state machine 112, on-chip address decoder 114, power control 116, controller 122, row decoder 124, dummy switch transistors 704, 708, 716, 718. The dummy memory cell control gate biasing means could comprise other hardware and/or software.

In one embodiment, the data memory cell control gate biasing means includes one or more of state machine 112, on-chip address decoder 114, power control 116, controller 122, row decoder 124, data switch transistors 706. The data memory cell control gate biasing means could comprise other hardware and/or software.

In one embodiment, the sensing means for sensing a selected memory cell on the string includes one or more of state machine 112, on-chip address decoder 114, power control 116, controller 122, row decoder 124, column decoder 132, read/write circuits 128, sense block 150. The sensing means could comprise other hardware and/or software.

In one embodiment, the first control means for controlling the data memory cell control gate biasing means to allow a voltage on the data memory cell control gates to creep up after the selected memory cell is sensed includes one or more of state machine 112, on-chip address decoder 114, power control 116, controller 122, row decoder 124. The first control means may comprise other hardware and/or software.

In one embodiment, the second control means for controlling the dummy memory cell control gate biasing means and the data memory cell control gate biasing means to maintain the crept up voltage on the data memory cell control gates and at the same time discharge a voltage on the dummy memory cell control gate includes one or more of state machine 112, on-chip address decoder 114, power control 116, controller 122, row decoder 124. The second control means may comprise other hardware and/or software.

Herein, means for applying a first voltage to an input of the dummy memory cell control gate biasing means and a second voltage to inputs of the data memory cell control gate biasing means, the first voltage is lower in magnitude than the second voltage, includes one or more of state machine 112, on-chip address decoder 114, power control 116, controller 122, row decoder 124. The means for applying a first voltage to an input of the dummy memory cell control gate biasing means and a second voltage to inputs of the data memory cell control gate biasing means may comprise other hardware and/or software.

For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a string of non-volatile memory cells having data memory cells, a dummy memory cell, and a select gate, the dummy memory cell between the data memory cells and the select gate;
   a dummy control gate switch configured to transfer a voltage to a control gate of the dummy memory cell;
   a plurality of data control gate switches configured to transfer voltages to control gates of the data memory cells; and
   a control circuit in communication with the string of non-volatile memory cells, the dummy control gate switch, and the plurality of data control gate switches, the control circuit configured to:
   sense a selected memory cell on the string;
   provide conditions that allow a voltage on the data memory cell control gates to creep up after the selected memory cell is sensed; and
   control the dummy control gate switch and the plurality of data control gate switches to maintain the crept up voltage on the data memory cell control gates and at the same time discharge a voltage on the dummy memory cell control gate.

2. The apparatus of claim 1 wherein, to maintain the crept up voltage on the data memory cell control gates and at the same time discharge a voltage on the dummy memory cell control gate, the control circuit is further configured to:
   turn the data control gate switches off to maintain the crept up voltage on the data memory cell control gates and keep the dummy control gate switch on to discharge a voltage on the dummy memory cell control gate.

3. The apparatus of claim 1, wherein, to maintain the crept up voltage on the data memory cell control gates and at the same time discharge a voltage on the dummy memory cell control gate, the control circuit is further configured to:
   apply a first voltage to an input of the dummy control gate switch and a second voltage to inputs of the data control gate switches, the first voltage is lower in magnitude than the second voltage.

4. The apparatus of claim 3, wherein the control circuit is further configured to:
turn the dummy control gate switch and the data control gate switches off while the first and second voltages are applied.

5. The apparatus of claim 4, wherein the first voltage is ground.

6. The apparatus of claim 5, wherein the second voltage is an intermediate voltage between ground and the crept up voltage.

7. The apparatus of claim 3, wherein the control circuit is further configured to:
turn the dummy control gate switch and the data control gate switches on while the first and second voltages are applied.

8. The apparatus of claim 7, wherein the first voltage is ground.

9. The apparatus of claim 8, wherein the second voltage is approximately the crept up voltage.

10. The apparatus of claim 7, wherein the string of non-volatile memory cells is a first string in a first block of memory cells, and the dummy control gate switch is a first dummy control gate switch, and further comprising:
a second dummy control gate switch configured to transfer a voltage to a dummy memory cell of a second string in a second block of memory cells; and
a block select line that is connected to both the first and second dummy control gate switches, the block select line configured to provide a signal to turn both the first and second dummy control gate switches on and off together,
wherein the control circuit is further configured to perform a memory array operation in the second block while controlling the first dummy control gate switch and the plurality of data control gate switches to maintain the crept up voltage on the data memory cell control gates of the first string and at the same time discharge a voltage on the dummy memory cell control gate of the first string.

11. The apparatus of claim 1, wherein the string of non-volatile memory cells is a NAND string in a three-dimensional memory array.

12. A method of operating non-volatile storage, the method comprising:
sensing a selected data memory cell on NAND string of non-volatile memory cells having data memory cells, a dummy memory cell, and a select gate, the dummy memory cell immediately adjacent to the select gate, the sensing including providing a read pass voltage to a dummy control gate switch to pass the read pass voltage to a control gate of the dummy memory cell, providing a read reference voltage to a data control gate switch to pass the read reference voltage to a control gate of the selected data memory cell, and providing a read pass voltage to data control gate switches to pass the read pass voltage to control gates of unselected data memory cells on the string;
turning off the data control gate switches after the selected data memory cell is sensed to allow a voltage on the data memory cell control gates to creep up; and
controlling the data control gate switches to maintain the crept up voltage on the data memory cell control gates while controlling the dummy control gate switch to discharge a voltage on a control gate of the dummy memory cell.

13. The method of claim 12, wherein controlling the data control gate switches to maintain the crept up voltage on the data memory cell control gates while controlling the dummy control gate switch to discharge a voltage on a control gate of the dummy memory cell comprises:
turning off data switch transistors to maintain the crept up voltage on the data memory cell control gates while turning on a dummy switch transistor to discharge a voltage on a control gate of the dummy memory cell.

14. The method of claim 12, wherein controlling the data control gate switches to maintain the crept up voltage on the data memory cell control gates while controlling the dummy control gate switch to discharge a voltage on a control gate of the dummy memory cell comprises:
applying a first voltage to a drain of a dummy switch transistor and a second voltage to drains of data switch transistors, the first voltage is lower in magnitude than the second voltage.

15. The method of claim 14, further comprising:
turning the dummy switch transistor and the data switch transistors off while the first and second voltages are applied.

16. The method of claim 14, further comprising:
turning the dummy switch transistor and the data switch transistors on while the first and second voltages are applied.

17. The method of claim 12, wherein controlling the data control gate switches to maintain the crept up voltage on the data memory cell control gates while controlling the dummy control gate switch to discharge a voltage on a control gate of the dummy memory cell is performed in a ready phase immediately after sensing the selected data memory cell.

18. The method of claim 12, wherein controlling the data control gate switches to maintain the crept up voltage on the data memory cell control gates while controlling the dummy control gate switch to discharge a voltage on a control gate of the dummy memory cell is performed in a busy phase in which a different block of memory cells that shares a common block select line is undergoing a memory array operation.

19. A three-dimensional non-volatile memory system, comprising:
a NAND string of non-volatile memory cells having data memory cells, a dummy memory cell, and a select gate, the dummy memory cell between the data memory cells and the select gate;
dummy memory cell control gate biasing means for transferring a voltage to a control gate of the dummy memory cell;
data memory cell control gate biasing means for transferring voltages to control gates of the data memory cells;
sensing means for sensing a selected memory cell on the string;
first control means for controlling the data memory cell control gate biasing means to allow a voltage on the data memory cell control gates to creep up after the selected memory cell is sensed; and
second control means for controlling the dummy memory cell control gate biasing means and the data memory cell control gate biasing means to maintain the crept up voltage on the data memory cell control gates and at the same time discharge a voltage on the dummy memory cell control gate.

20. The three-dimensional non-volatile memory system of claim 19, further comprising:
means for applying a first voltage to an input of the dummy memory cell control gate biasing means and a second voltage to inputs of the data memory cell control gate biasing means, the first voltage is lower in magnitude than the second voltage.

* * * * *